US012699627B2

(12) United States Patent
Dekel et al.

(10) Patent No.: US 12,699,627 B2
(45) Date of Patent: Aug. 4, 2026

(54) POLAR-BCH COMBINED GENERALIZED CONCATENATED CODES

(71) Applicant: Samsung Electronics Co., Ltd., Suwon-si (KR)

(72) Inventors: Idan Dekel, Tel Aviv (IL); Yaron Shany, Kfar Saba (IL); Amit Berman, Binyamina (IL); Ariel Doubchak, Herzliya (IL)

(73) Assignee: Samsung Electronics Co. Ltd., Suwon-si (KR)

( * ) Notice: Subject to any disclaimer, the term of this patent is extended or adjusted under 35 U.S.C. 154(b) by 57 days.

(21) Appl. No.: 18/754,892

(22) Filed: Jun. 26, 2024

(65) Prior Publication Data

US 2026/0003728 A1    Jan. 1, 2026

(51) Int. Cl.
G06F 11/10 (2006.01)
H03M 13/11 (2006.01)

(52) U.S. Cl.
CPC ...... G06F 11/1048 (2013.01); G06F 11/1068 (2013.01); H03M 13/11 (2013.01)

(58) Field of Classification Search
CPC ............ G06F 11/1048; G06F 11/1068; G06F 11/1012; G06F 11/1044; G06F 11/1008; G06F 11/108; G06F 2211/109; H03M 13/3707; H03M 13/2906; H03M 13/152; H03M 13/1111; H03M 13/1102; H03M 13/1108
See application file for complete search history.

(56) References Cited

U.S. PATENT DOCUMENTS

| | | | |
|---|---|---|---|
| 8,621,318 B1 * | 12/2013 | Micheloni | G06F 11/1012 714/755 |
| 11,031,956 B2 | 6/2021 | Berman et al. | |
| 11,387,848 B1 | 7/2022 | Berman et al. | |
| 11,405,055 B2 * | 8/2022 | Arikan | H03M 13/2906 |
| 11,581,906 B1 * | 2/2023 | Berman | H03M 13/2918 |
| 11,677,500 B2 * | 6/2023 | Arikan | H04L 1/0064 714/1 |
| 12,388,468 B2 * | 8/2025 | Doubchak | H03M 13/253 |
| 12,438,637 B2 * | 10/2025 | Robinson | H03M 13/618 |
| 2009/0125790 A1 | 5/2009 | Iyer et al. | |

(Continued)

FOREIGN PATENT DOCUMENTS

| | | |
|---|---|---|
| EP | 4462434 A1 | 11/2024 |
| WO | 2018/080027 A1 | 5/2018 |
| WO | 2020/080300 A1 | 4/2020 |

(Continued)

OTHER PUBLICATIONS

K. Ivanov et al. 'Hybrid Decoding of Interlinked Generalized Concatenated Codes' 9th International Symposium On Turbo Codes & Iterative Information Processing, IEEE, 2016, pp. 41-45.

(Continued)

*Primary Examiner* — Justin R Knapp

(74) *Attorney, Agent, or Firm* — Fish & Richardson P.C.

(57) ABSTRACT

A nonvolatile memory device includes a memory and processing circuitry configured to receive a read request from a host, read an ECC noisy codeword from the memory based on the read request, determine to decode the ECC noisy codeword using a first decoder or a second decoder, and decode the ECC noisy codeword using the determined decoder.

18 Claims, 26 Drawing Sheets

(56) References Cited

U.S. PATENT DOCUMENTS

2016/0079999 A1*  3/2016  Shen ..................... H03M 13/09
                                                    714/758
2020/0004626 A1    1/2020  Pignatelli et al.

FOREIGN PATENT DOCUMENTS

WO      2022/080251 A1    4/2022
WO      2022/080313 A1    4/2022

OTHER PUBLICATIONS

C. Lin et al. 'Transformation of Binary Linear Block Codes to Polar Codes with Dynamic Frozen' Open Journal of the Communications Society, IEEE, 2020, vol. 1, pp. 333-341.
Arikan, E. (2009). "Channel Polarization: A Method for Constructing Capacity-Achieving Codes for Symmetric Binary-Input Memoryless Channels". IEEE Transactions on Information Theory.
Sarkis et al., (2016). "Flexible and low complexity encoding and decoding of systematic polar codes". IEEE Transactions on Communications, arXiv:1507.03614.
Trifonov et al., (2015). "Polar subcodes". IEEE JSAC special issue on Recent Advances In Capacity Approaching Codes, arXiv:1511.01646 [cs.IT].

* cited by examiner

Figure 5A:
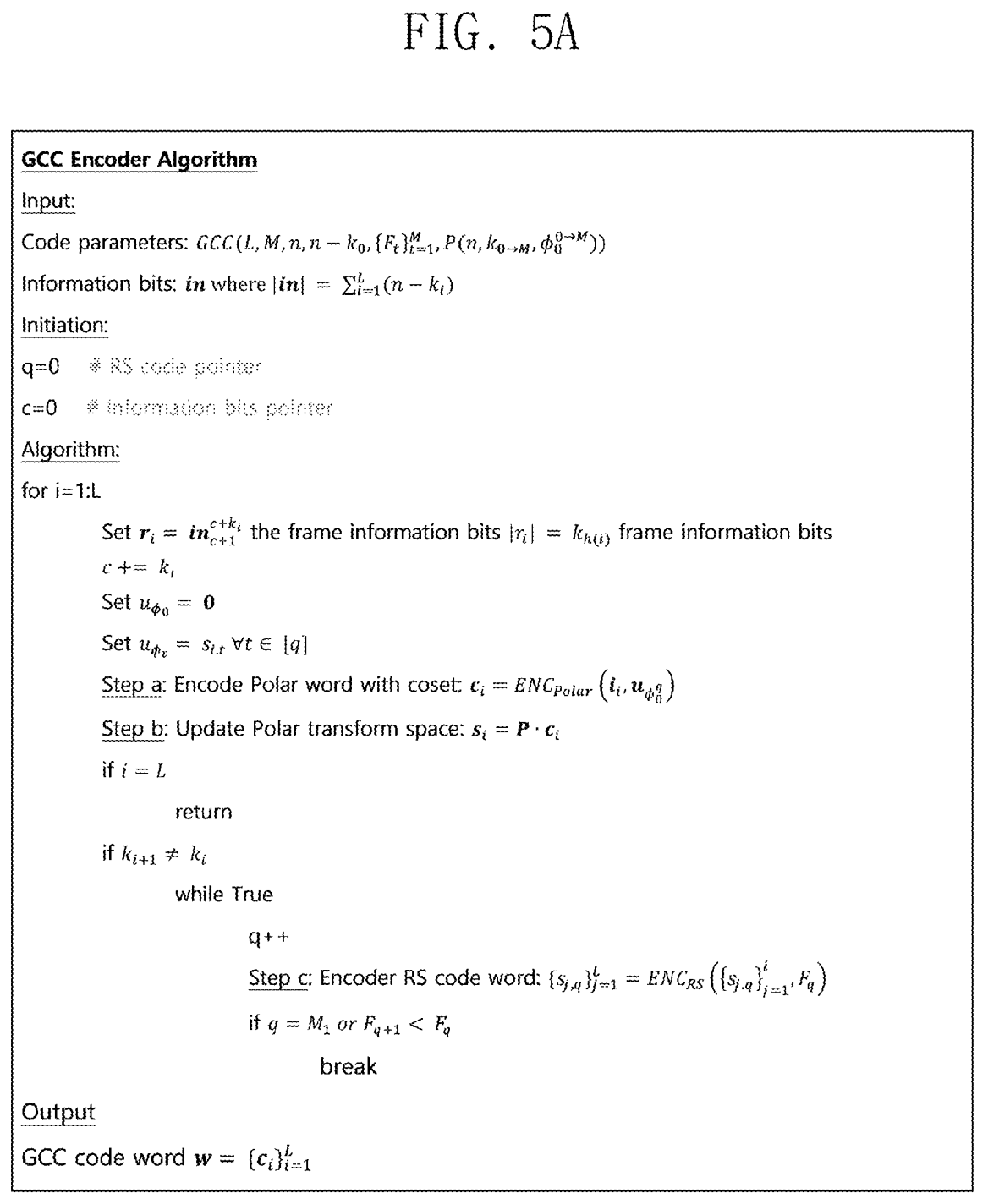

GCC Encoder Algorithm

Input:

Code parameters: $GCC(L, M, n, n - k_0, \{F_t\}_{t=1}^{M}, P(n, k_{0 \to M}, \phi_0^{0 \to M}))$ Information bits: $in$ where $|in| = \sum_{i=1}^{L}(n - k_i)$ Initiation:

q=0    # RS code pointer c=0    # Information bits pointer

Algorithm:

for i=1:L

Set $r_i = in_{c+1}^{c+k_i}$ the frame information bits $|r_i| = k_{h(i)}$ frame information bits
        $c += k_i$ Set $u_{\phi_0} = \mathbf{0}$ Set $u_{\phi_t} = s_{t,t} \, \forall t \in [q]$ <u>Step a</u>: Encode Polar word with coset: $c_i = ENC_{Polar}\left(i_i, u_{\phi_0^q}\right)$ <u>Step b</u>: Update Polar transform space: $s_i = P \cdot c_i$ if $i = L$ return if $k_{i+1} \neq k_i$ while True q++

<u>Step c</u>: Encoder RS code word: $\{s_{j,q}\}_{j=1}^{L} = ENC_{RS}\left(\{s_{j,q}\}_{j=1}^{i}, F_q\right)$ if $q = M_1$ or $F_{q+1} < F_q$ break Output GCC code word $w = \{c_i\}_{i=1}^{L}$

FIG. 6A

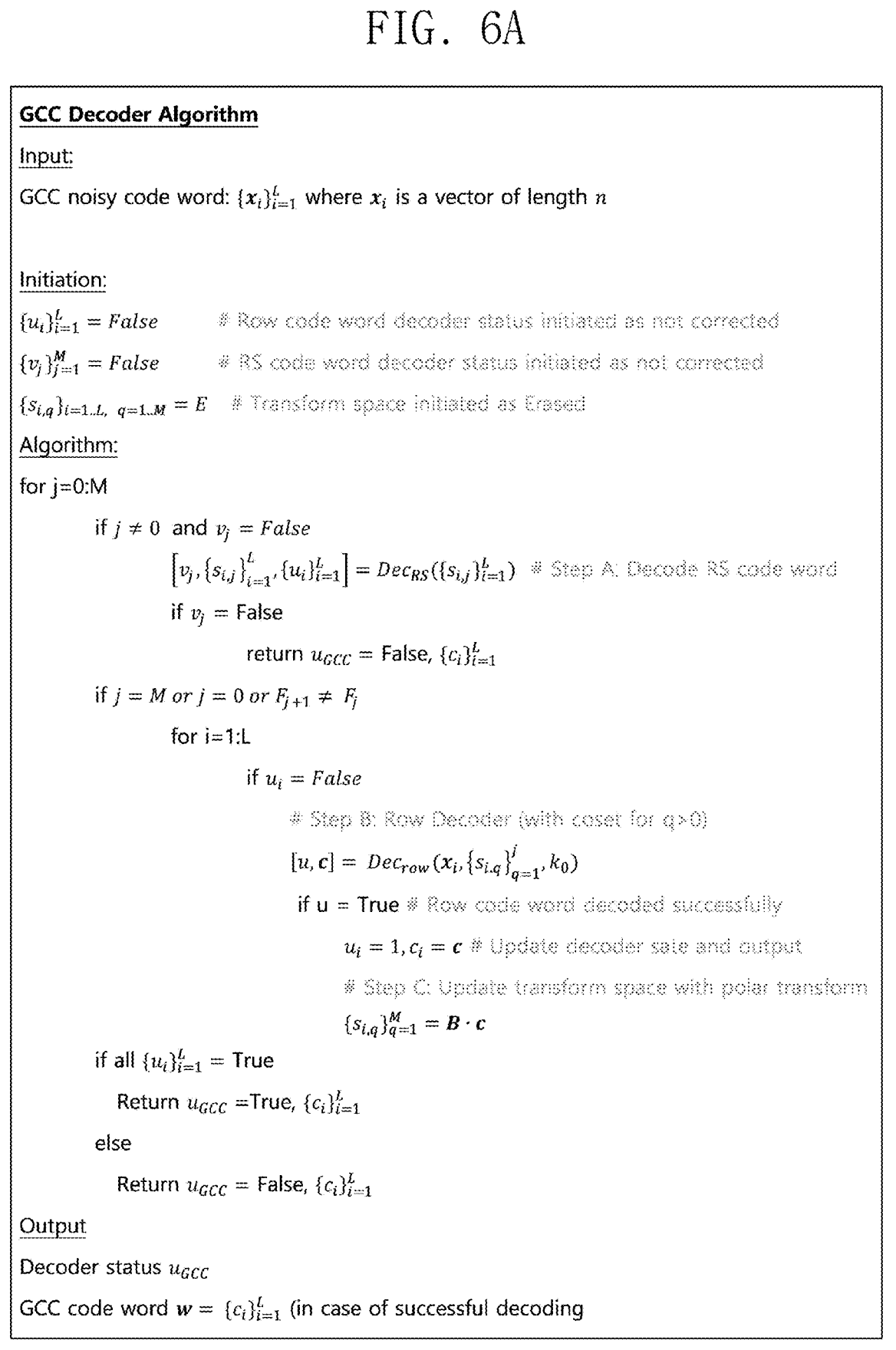

GCC Decoder Algorithm

<u>Input:</u>

GCC noisy code word: $\{x_i\}_{i=1}^L$ where $x_i$ is a vector of length $n$

<u>Initiation:</u>

$\{u_i\}_{i=1}^L = False$          # Row code word decoder status initiated as not corrected $\{v_j\}_{j=1}^M = False$          # RS code word decoder status initiated as not corrected $\{s_{i,q}\}_{i=1..L,\ q=1..M} = E$    # Transform space initiated as Erased <u>Algorithm:</u> for j=0:M if $j \neq 0$ and $v_j = False$ $\left[ v_j, \{s_{i,j}\}_{i=1}^L, \{u_i\}_{i=1}^L \right] = Dec_{RS}(\{s_{i,j}\}_{i=1}^L)$  # Step A: Decode RS code word if $v_j$ = False return $u_{GCC}$ = False, $\{c_i\}_{i=1}^L$ if $j = M$ or $j = 0$ or $F_{j+1} \neq F_j$ for i=1:L if $u_i = False$

Step B: Row Decoder (with coset for q>0)

$[u, c] = Dec_{row}(x_i, \{s_{i,q}\}_{q=1}^j, k_0)$ if u = True # Row code word decoded successfully $u_i = 1, c_i = c$ # Update decoder sate and output

Step C: Update transform space with polar transform $\{s_{i,q}\}_{q=1}^M = B \cdot c$ if all $\{u_i\}_{i=1}^L$ = True Return $u_{GCC}$ =True, $\{c_i\}_{i=1}^L$ else Return $u_{GCC}$ = False, $\{c_i\}_{i=1}^L$ <u>Output</u>

Decoder status $u_{GCC}$

GCC code word $w = \{c_i\}_{i=1}^L$ (in case of successful decoding

Erased RS symbols

Transform space update

Uncoded rows bits

Decoded rows bits

Decoded RS symbols

FIG. 7

Initiation:

$$A^0 = H_{t_0} \cdot G$$

Perform Gaussian elimination with a sequence of row operations, defined by the matrix $Q_0$ $$\Delta^0 = Q^0 \cdot A^0$$

$\Delta^0$ is a matrix with $m \cdot t_0$ leading ones (maximal indices), defining $\delta^{t_0}$, such that $$\sum_{j \in J_{\delta_i^{t_0}}} \Delta^0_{i,j} \cdot u_j + u_{\delta_i^{t_0}} = f^0_{\delta_i^{t_0}} \quad i \in [m \cdot t_0]$$

where $f^0_{\delta_i^{t_0}}$ is the coset value corresponding to dynamic frozen $\delta_i^{t_0} \in \delta^{t_0}$ Construction:

q=0 while $t_q \leq t_p$ q++

$$A^q = H_{t_{q-1} \to t_q} \cdot G$$

Perform row operations on the matrixes $\Delta^i i \in [q-1]^*$ to zero all columns belonging to $\delta^{t_q-1}$ in $A^q$. Those row operations define the matrixes $Q^{qi}$:

$$B^q = A^q + \sum_{i=0}^{q-1} Q^{qi} \cdot \Delta^i$$

Perform Gaussian elimination with a sequence of row operations, defined by the matrix $Q^q$ $$\Delta^q = Q^q \cdot B^q$$

The $m \cdot (t_q - t_{q-1})$ leading ones in $\Delta^q$ define the set $\delta^{t_q} \backslash \delta^{t_q-1} \triangleq \Delta\delta^q$ By the construction, it is guaranteed that for all $i \in [m \cdot (t_q - t_{q-1})]$:

$$\Delta^q_{i,j} = 0 \ \forall j \geq \Delta\delta_i^q$$

$$\Delta^q_{i,j} = 0 \ \forall j \in \delta^{t_q-1}$$

$$\Delta^q_{i,\Delta\delta_i^q} = 1$$

FIG. 8
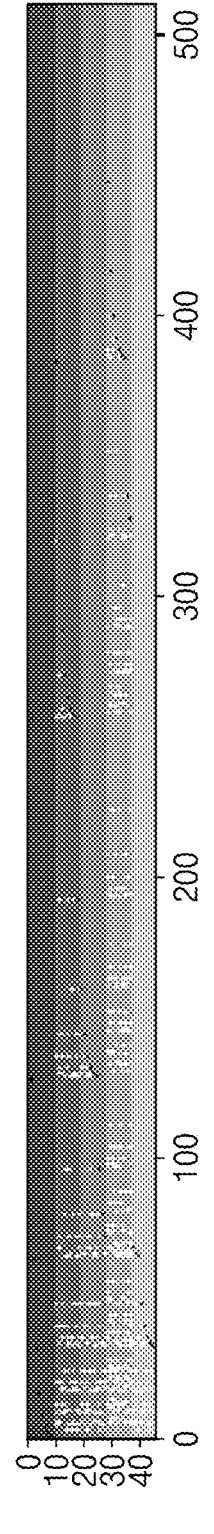
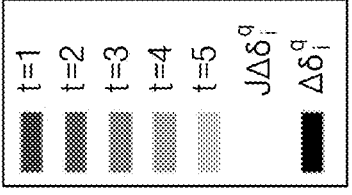

FIG. 9

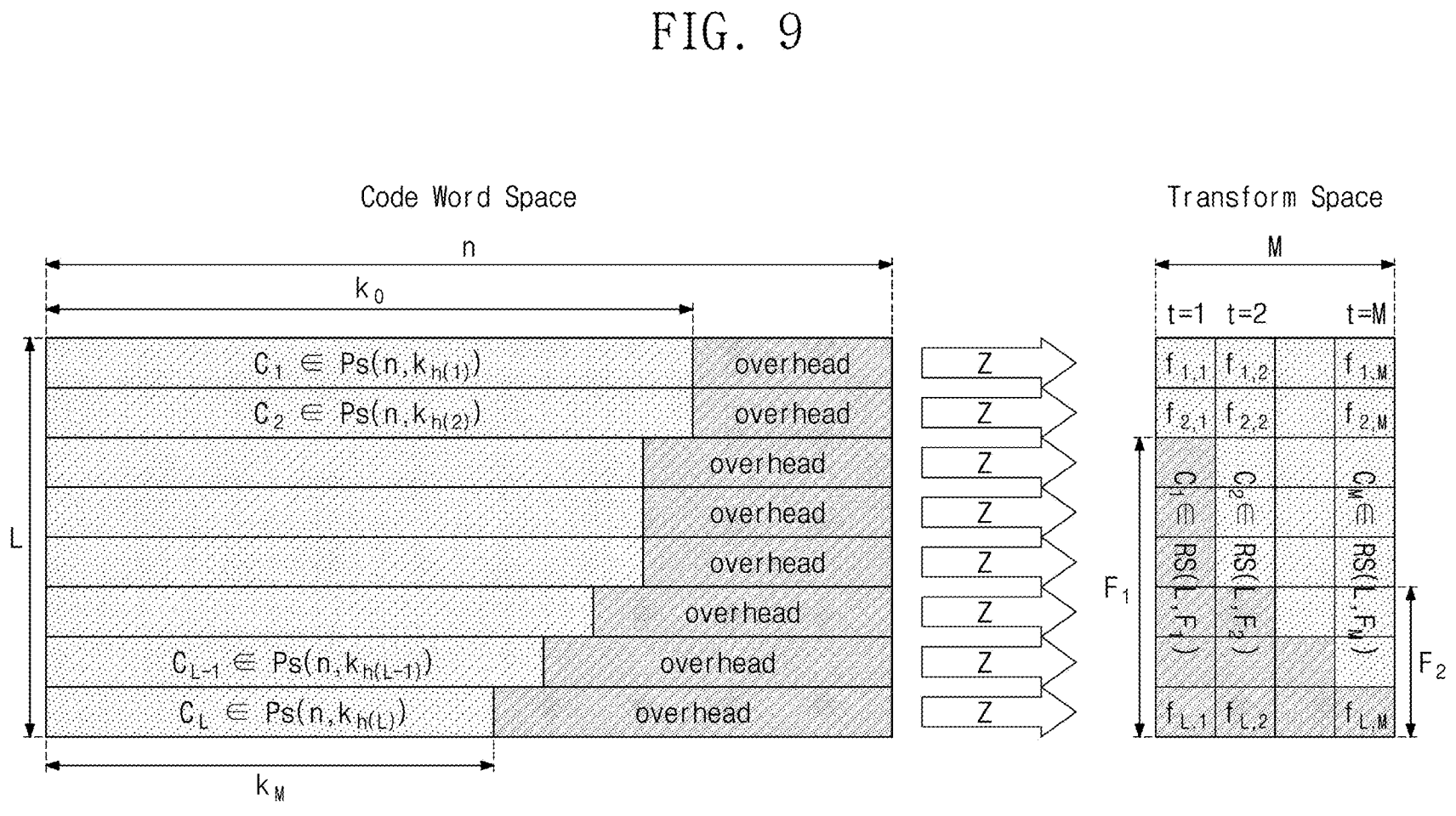

Transform Space $t=1$   $t=2$   $t=M$ $M$ $f_{1,1}$   $f_{1,2}$   $f_{1,M}$ $f_{2,1}$   $f_{2,2}$   $f_{2,M}$ $C_1 \in RS(L,F_1)$ $C_2 \in RS(L,F_2)$ $C_M \in RS(L,F_N)$ $f_{L,1}$   $f_{L,2}$   $f_{L,M}$ $F_1$ $F_2$ $Z$ $Z$ $Z$ $Z$ $Z$ $Z$ $Z$ $Z$ Code Word Space $n$ $k_0$ $k_M$ $C_1 \in Ps(n,k_{h(1)})$ $C_2 \in Ps(n,k_{h(2)})$ $C_{L-1} \in Ps(n,k_{h(L-1)})$ $C_L \in Ps(n,k_{h(L)})$ overhead $L$

FIG. 16A

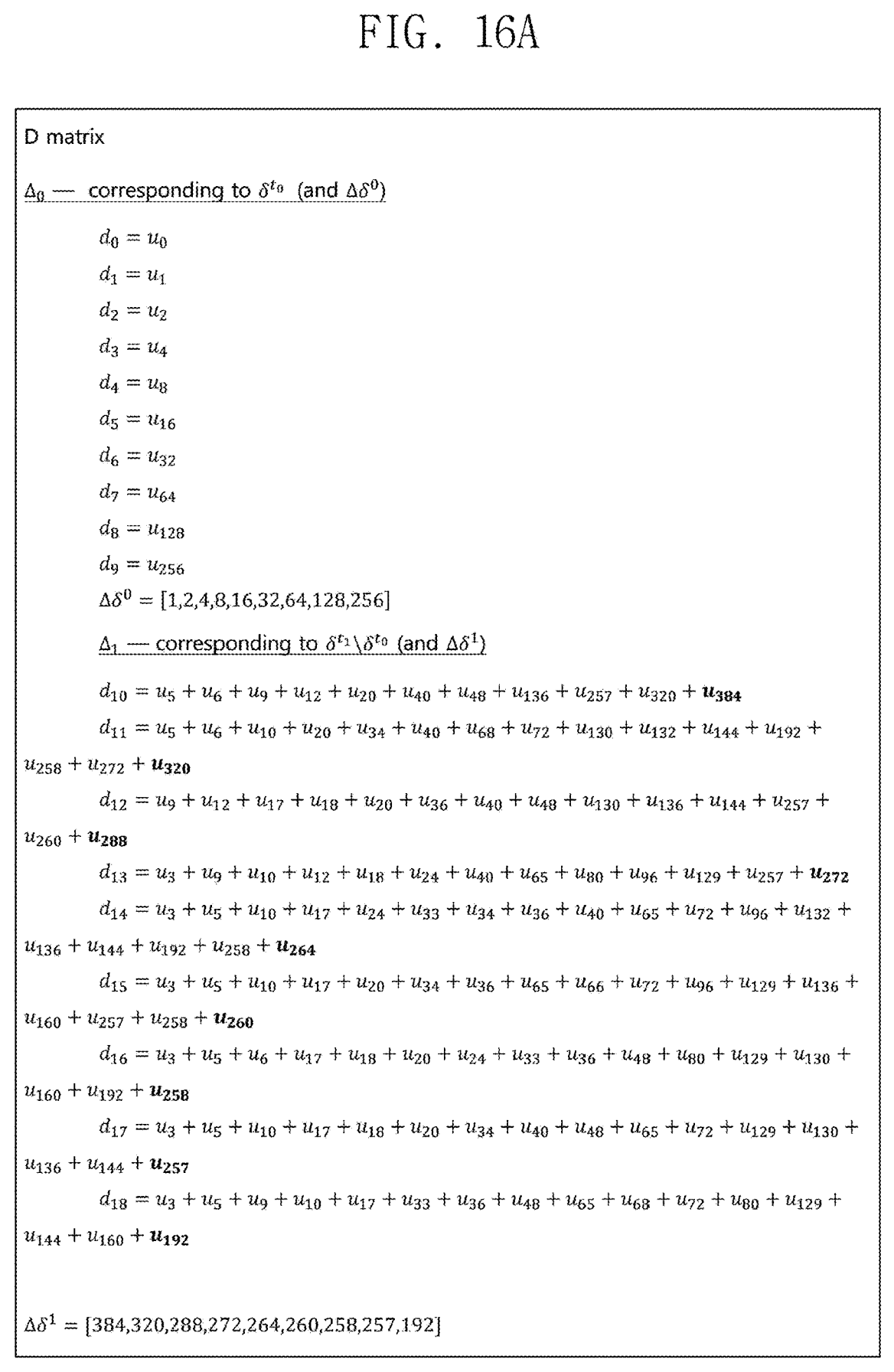

D matrix $\underline{\Delta_0}$ — corresponding to $\delta^{t_0}$ (and $\Delta\delta^0$)

$d_0 = u_0$ $d_1 = u_1$ $d_2 = u_2$ $d_3 = u_4$ $d_4 = u_8$ $d_5 = u_{16}$ $d_6 = u_{32}$ $d_7 = u_{64}$ $d_8 = u_{128}$ $d_9 = u_{256}$ $\Delta\delta^0 = [1,2,4,8,16,32,64,128,256]$ $\underline{\Delta_1}$ — corresponding to $\delta^{t_1}\backslash\delta^{t_0}$ (and $\Delta\delta^1$)

$d_{10} = u_5 + u_6 + u_9 + u_{12} + u_{20} + u_{40} + u_{48} + u_{136} + u_{257} + u_{320} + \boldsymbol{u_{384}}$ $d_{11} = u_5 + u_6 + u_{10} + u_{20} + u_{34} + u_{40} + u_{68} + u_{72} + u_{130} + u_{132} + u_{144} + u_{192} + u_{258} + u_{272} + \boldsymbol{u_{320}}$ $d_{12} = u_9 + u_{12} + u_{17} + u_{18} + u_{20} + u_{36} + u_{40} + u_{48} + u_{130} + u_{136} + u_{144} + u_{257} + u_{260} + \boldsymbol{u_{288}}$ $d_{13} = u_3 + u_9 + u_{10} + u_{12} + u_{18} + u_{24} + u_{40} + u_{65} + u_{80} + u_{96} + u_{129} + u_{257} + \boldsymbol{u_{272}}$ $d_{14} = u_3 + u_5 + u_{10} + u_{17} + u_{24} + u_{33} + u_{34} + u_{36} + u_{40} + u_{65} + u_{72} + u_{96} + u_{132} + u_{136} + u_{144} + u_{192} + u_{258} + \boldsymbol{u_{264}}$ $d_{15} = u_3 + u_5 + u_{10} + u_{17} + u_{20} + u_{34} + u_{36} + u_{65} + u_{66} + u_{72} + u_{96} + u_{129} + u_{136} + u_{160} + u_{257} + u_{258} + \boldsymbol{u_{260}}$ $d_{16} = u_3 + u_5 + u_6 + u_{17} + u_{18} + u_{20} + u_{24} + u_{33} + u_{36} + u_{48} + u_{80} + u_{129} + u_{130} + u_{160} + u_{192} + \boldsymbol{u_{258}}$ $d_{17} = u_3 + u_5 + u_{10} + u_{17} + u_{18} + u_{20} + u_{34} + u_{40} + u_{48} + u_{65} + u_{72} + u_{129} + u_{130} + u_{136} + u_{144} + \boldsymbol{u_{257}}$ $d_{18} = u_3 + u_5 + u_9 + u_{10} + u_{17} + u_{33} + u_{36} + u_{48} + u_{65} + u_{68} + u_{72} + u_{80} + u_{129} + u_{144} + u_{160} + \boldsymbol{u_{192}}$ $\Delta\delta^1 = [384,320,288,272,264,260,258,257,192]$ FIG. 16B
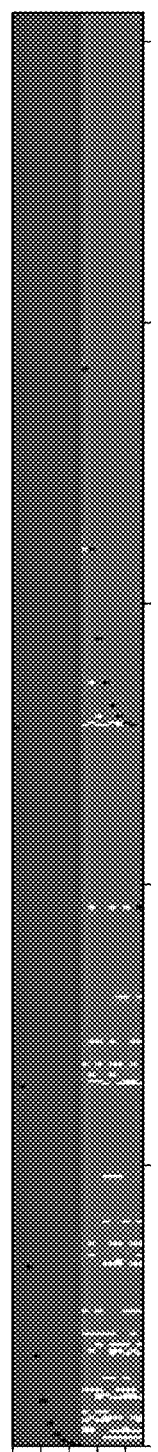
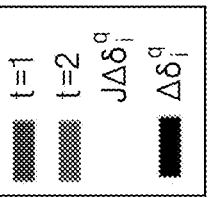

FIG. 16C $$Q^{1.0} = \begin{pmatrix} 0,0,0,0,0,0,1,0,0,0 \\ 0,0,0,0,1,0,0,0,0,0 \\ 0,0,1,0,0,1,0,1,1,0 \\ 0,0,0,0,0,1,0,0,1,0 \\ 0,0,0,1,0,0,0,0,1,0 \\ 0,1,0,0,1,0,0,1,0,0 \\ 0,0,0,0,0,0,1,0,0 \\ 0,0,0,0,0,1,0,0,0,0 \\ 1,0,0,1,0,0,1,0,1,0 \end{pmatrix}, Q^1 = \begin{pmatrix} 0,0,0,0,0,0,1,0,0 \\ 0,0,0,0,1,0,0,0,0 \\ 0,0,1,0,0,0,0,0,0 \\ 1,0,0,0,0,0,0,0,0 \\ 1,0,0,0,1,0,1,1,0 \\ 0,1,0,0,0,0,0,0,0 \\ 0,0,0,1,0,0,0,0,0 \\ 0,0,1,0,0,1,0,0,0 \\ 0,0,0,1,0,0,0,0,1 \end{pmatrix}$$

FIG. 18A

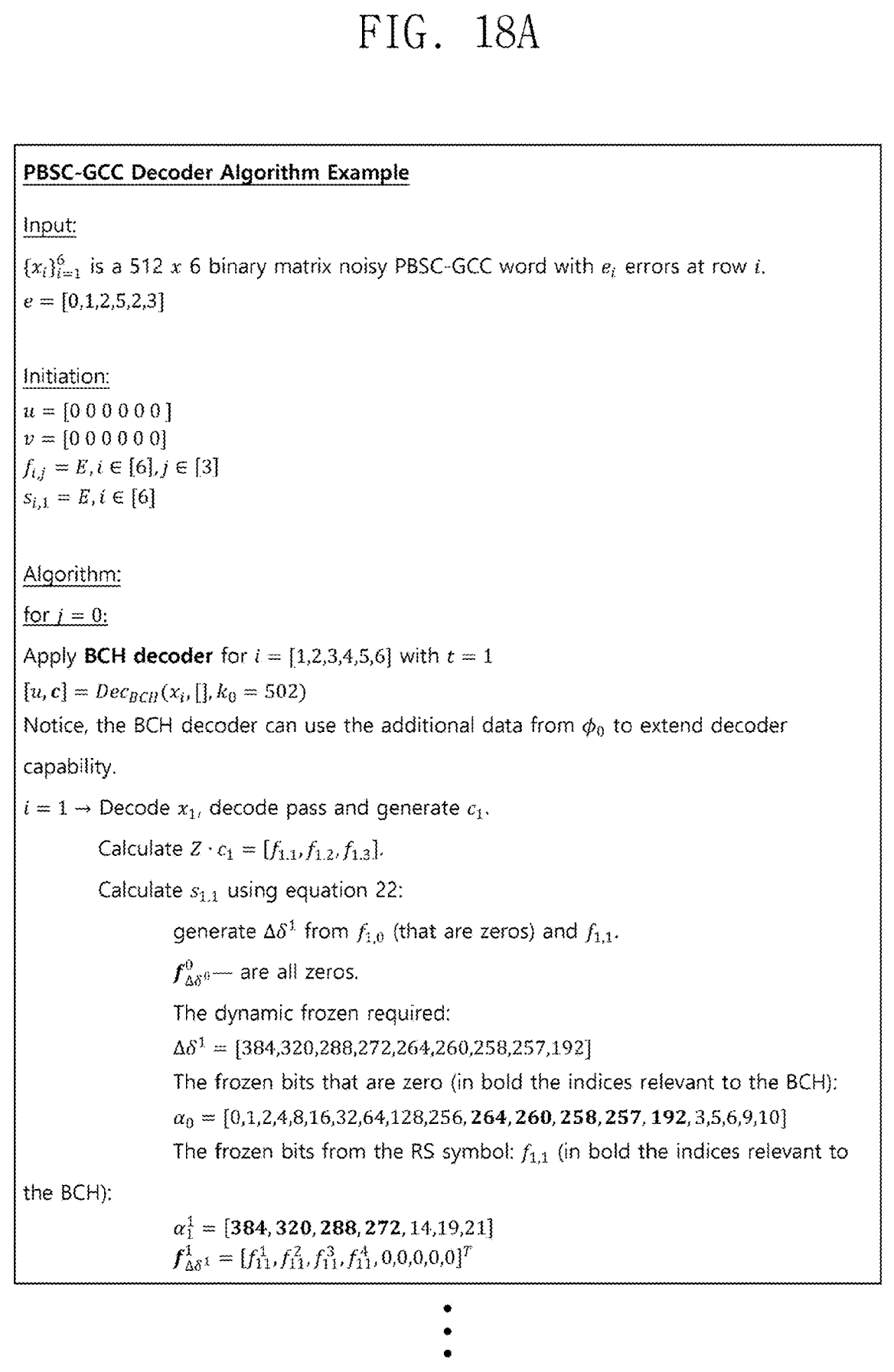

PBSC-GCC Decoder Algorithm Example

Input:

$\{x_i\}_{i=1}^{6}$ is a 512 $x$ 6 binary matrix noisy PBSC-GCC word with $e_i$ errors at row $i$.

$e = [0,1,2,5,2,3]$

Initiation:

$u = [0\ 0\ 0\ 0\ 0\ 0]$ $v = [0\ 0\ 0\ 0\ 0\ 0]$ $f_{i,j} = E, i \in [6], j \in [3]$ $s_{i,1} = E, i \in [6]$

Algorithm:

for $j = 0$:

Apply BCH decoder for $i = [1,2,3,4,5,6]$ with $t = 1$ $[u, c] = Dec_{BCH}(x_i, [], k_0 = 502)$ Notice, the BCH decoder can use the additional data from $\phi_0$ to extend decoder capability.

$i = 1 \rightarrow$ Decode $x_1$, decode pass and generate $c_1$.

Calculate $Z \cdot c_1 = [f_{1,1}, f_{1,2}, f_{1,3}]$.

Calculate $s_{1,1}$ using equation 22:

generate $\Delta\delta^1$ from $f_{1,0}$ (that are zeros) and $f_{1,1}$.

$f_{\Delta\delta^0}^0$— are all zeros.

The dynamic frozen required:

$\Delta\delta^1 = [384,320,288,272,264,260,258,257,192]$

The frozen bits that are zero (in bold the indices relevant to the BCH):

$\alpha_0 = [0,1,2,4,8,16,32,64,128,256,\mathbf{264},\mathbf{260},\mathbf{258},\mathbf{257},\mathbf{192},3,5,6,9,10]$ The frozen bits from the RS symbol: $f_{1,1}$ (in bold the indices relevant to the BCH):

$\alpha_1^1 = [\mathbf{384},\mathbf{320},\mathbf{288},\mathbf{272},14,19,21]$ $f_{\Delta\delta^1}^1 = [f_{11}^1, f_{11}^2, f_{11}^3, f_{11}^4, 0,0,0,0,0]^T$

Apply: $s^1 = (Q^1)^{-1} \cdot f^1_{\Delta\delta^1}$ $s_{1,1} = s^1$ — The BCH syndrome coset of frame $i=1$ $i = 2 \rightarrow$ Decode $x_2$, decode pass and generate $c_2$.

Figure 18B:
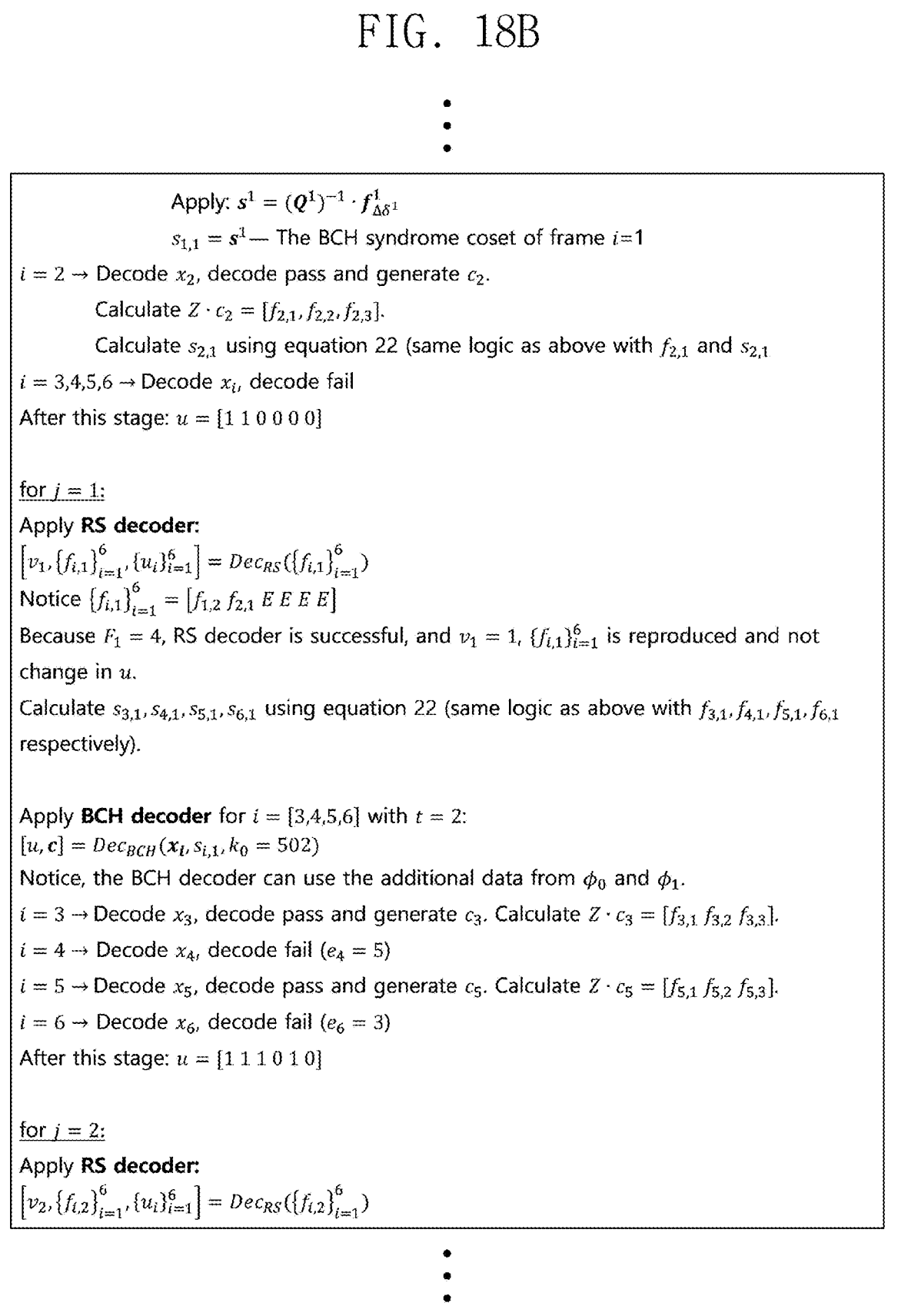

Calculate $Z \cdot c_2 = [f_{2,1}, f_{2,2}, f_{2,3}]$.

Calculate $s_{2,1}$ using equation 22 (same logic as above with $f_{2,1}$ and $s_{2,1}$ $i = 3,4,5,6 \rightarrow$ Decode $x_i$, decode fail After this stage: $u = [1\ 1\ 0\ 0\ 0\ 0]$ <u>for $j = 1$:</u>

Apply RS decoder:

$\left[ v_1, \{f_{i,1}\}_{i=1}^{6}, \{u_i\}_{i=1}^{6} \right] = Dec_{RS}(\{f_{i,1}\}_{i=1}^{6})$ Notice $\{f_{i,1}\}_{i=1}^{6} = \left[ f_{1,2}\ f_{2,1}\ E\ E\ E\ E \right]$ Because $F_1 = 4$, RS decoder is successful, and $v_1 = 1$, $\{f_{i,1}\}_{i=1}^{6}$ is reproduced and not change in $u$.

Calculate $s_{3,1}, s_{4,1}, s_{5,1}, s_{6,1}$ using equation 22 (same logic as above with $f_{3,1}, f_{4,1}, f_{5,1}, f_{6,1}$ respectively).

Apply BCH decoder for $i = [3,4,5,6]$ with $t = 2$:

$[u, c] = Dec_{BCH}(x_i, s_{i,1}, k_0 = 502)$

Notice, the BCH decoder can use the additional data from $\phi_0$ and $\phi_1$.

$i = 3 \rightarrow$ Decode $x_3$, decode pass and generate $c_3$. Calculate $Z \cdot c_3 = [f_{3,1}\ f_{3,2}\ f_{3,3}]$.

$i = 4 \rightarrow$ Decode $x_4$, decode fail ($e_4 = 5$)

$i = 5 \rightarrow$ Decode $x_5$, decode pass and generate $c_5$. Calculate $Z \cdot c_5 = [f_{5,1}\ f_{5,2}\ f_{5,3}]$.

$i = 6 \rightarrow$ Decode $x_6$, decode fail ($e_6 = 3$)

After this stage: $u = [1\ 1\ 1\ 0\ 1\ 0]$

<u>for $j = 2$:</u>

Apply RS decoder:

$\left[ v_2, \{f_{i,2}\}_{i=1}^{6}, \{u_i\}_{i=1}^{6} \right] = Dec_{RS}(\{f_{i,2}\}_{i=1}^{6})$

Figure 18C:
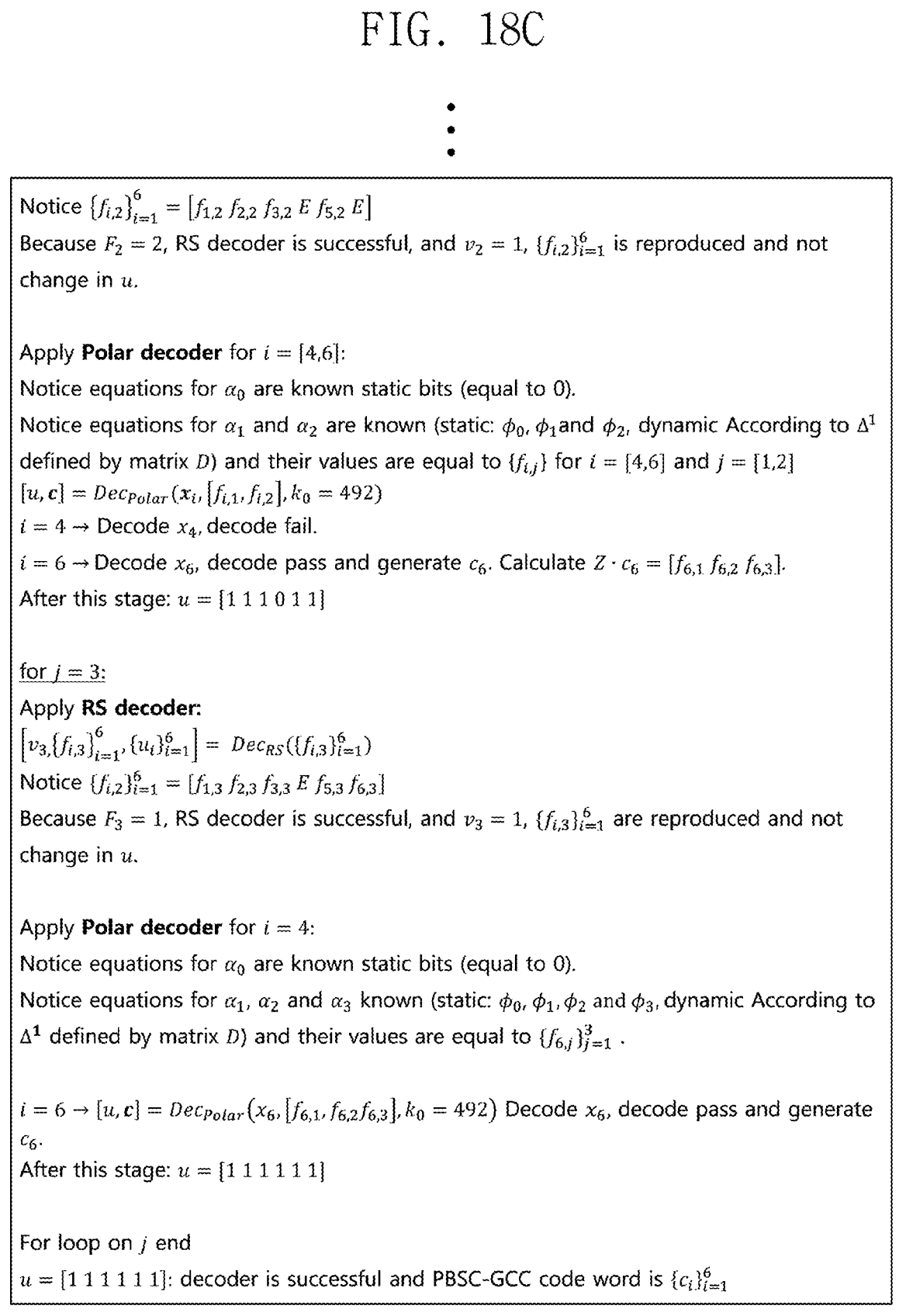

Notice $\{f_{i,2}\}_{i=1}^{6} = [f_{1,2}\ f_{2,2}\ f_{3,2}\ E\ f_{5,2}\ E]$

Because $F_2 = 2$, RS decoder is successful, and $v_2 = 1$, $\{f_{i,2}\}_{i=1}^{6}$ is reproduced and not change in $u$.

Apply Polar decoder for $i = [4,6]$:

Notice equations for $\alpha_0$ are known static bits (equal to 0).

Notice equations for $\alpha_1$ and $\alpha_2$ are known (static: $\phi_0$, $\phi_1$ and $\phi_2$, dynamic According to $\Delta^1$ defined by matrix $D$) and their values are equal to $\{f_{i,j}\}$ for $i = [4,6]$ and $j = [1,2]$ $[u, c] = Dec_{Polar}(x_i, [f_{i,1}, f_{i,2}], k_0 = 492)$ $i = 4 \rightarrow$ Decode $x_4$, decode fail.

$i = 6 \rightarrow$ Decode $x_6$, decode pass and generate $c_6$. Calculate $Z \cdot c_6 = [f_{6,1}\ f_{6,2}\ f_{6,3}]$.

After this stage: $u = [1\ 1\ 1\ 0\ 1\ 1]$

<u>for $j = 3$:</u>

Apply RS decoder:

$\left[v_3, \{f_{i,3}\}_{i=1}^{6}, \{u_i\}_{i=1}^{6}\right] = Dec_{RS}(\{f_{i,3}\}_{i=1}^{6})$ Notice $\{f_{i,2}\}_{i=1}^{6} = [f_{1,3}\ f_{2,3}\ f_{3,3}\ E\ f_{5,3}\ f_{6,3}]$ Because $F_3 = 1$, RS decoder is successful, and $v_3 = 1$, $\{f_{i,3}\}_{i=1}^{6}$ are reproduced and not change in $u$.

Apply Polar decoder for $i = 4$:

Notice equations for $\alpha_0$ are known static bits (equal to 0).

Notice equations for $\alpha_1$, $\alpha_2$ and $\alpha_3$ known (static: $\phi_0$, $\phi_1$, $\phi_2$ and $\phi_3$, dynamic According to $\Delta^1$ defined by matrix $D$) and their values are equal to $\{f_{6,j}\}_{j=1}^{3}$ .

$i = 6 \rightarrow [u, c] = Dec_{Polar}(x_6, [f_{6,1}, f_{6,2}f_{6,3}], k_0 = 492)$ Decode $x_6$, decode pass and generate $c_6$.

After this stage: $u = [1\ 1\ 1\ 1\ 1\ 1]$

For loop on $j$ end $u = [1\ 1\ 1\ 1\ 1\ 1]$: decoder is successful and PBSC-GCC code word is $\{c_i\}_{i=1}^{6}$

POLAR-BCH COMBINED GENERALIZED CONCATENATED CODES

BACKGROUND

NAND memory devices strive to achieve high read throughput and low latency with low power consumption and low complexity. In order to achieve these goals, a minimal number of reads from the NAND is performed such that a single bit from the NAND channel is measured per bit that is written, which results in a hard decision (HD) binary channel.

Effective error correcting codes (ECCs) for HD channels with good performance and low complexity are algebraic codes, such as BCH, RS and BCH-GCC codes.

SUMMARY

Some example embodiments of the inventive concepts described herein relate to an ECC scheme that combines code constructions of BCH-GCC and Polar-GCC, and exploits the intersection between the codes, a mutual optimization, and decoding algorithms that considers the combination of the codes.

According to some example embodiments, a nonvolatile memory device includes a memory and processing circuitry configured to receive a read request from a host, read an ECC noisy codeword from the memory based on the read request, determine to decode the ECC noisy codeword using a first decoder or a second decoder, and decode the ECC noisy codeword using the determined decoder.

According to some example embodiments, a method for performing error correction includes receiving a read request from a host, reading an ECC noisy codeword from a memory based on the read request, determining to decode the ECC noisy codeword using a first decoder or a second decoder, and decoding the ECC noisy codeword using the determined decoder. According to some example embodiments, a system includes a host and a nonvolatile memory apparatus including a memory and processing circuitry configured to receive a read request from a host, read an ECC noisy codeword from the memory based on the read request, determine to decode the ECC noisy codeword using a first decoder or a second decoder, and decode the ECC noisy codeword using the determined decoder.

According to some example embodiments, a non-volatile memory device stores computer program code that, when executed by processing circuitry, cause the processing circuitry to perform a method for performing error correction, the method including receiving a read request from a host, reading an ECC noisy codeword from a memory based on the read request, determining to decode the ECC noisy codeword using a first decoder or a second decoder, and decoding the ECC noisy codeword using the determined decoder.

According to some example embodiments, a nonvolatile memory device includes a means for receiving a read request from a host, a means for reading an ECC noisy codeword from a memory based on the read request, a means for determining to decode the ECC noisy codeword using a first decoder or a second decoder, and a means for decoding the ECC noisy codeword using the determined decoder.

BRIEF DESCRIPTION OF THE FIGURES

The above and other objects and features of the inventive concepts will become apparent by describing in detail some example embodiments thereof with reference to the accompanying drawings.

FIG. 2A is a block diagram of a host storage system 10 according to some example embodiments.

FIG. 4 is an example of a structure of a Polar-GCC.

FIG. 5A is an example of a GCC encoder algorithm.

FIG. 6A is an example of a GCC decoder algorithm.

FIG. 7 is an example algorithm for generating dynamic frozen equations according to example embodiments.

FIG. 8 is an example of matrix $$D_{\delta'}^{t_p}$$

according to example embodiments.

FIG. 9 is an example of the PBSCG-GCC code structure according to example embodiments.

Figure 10:
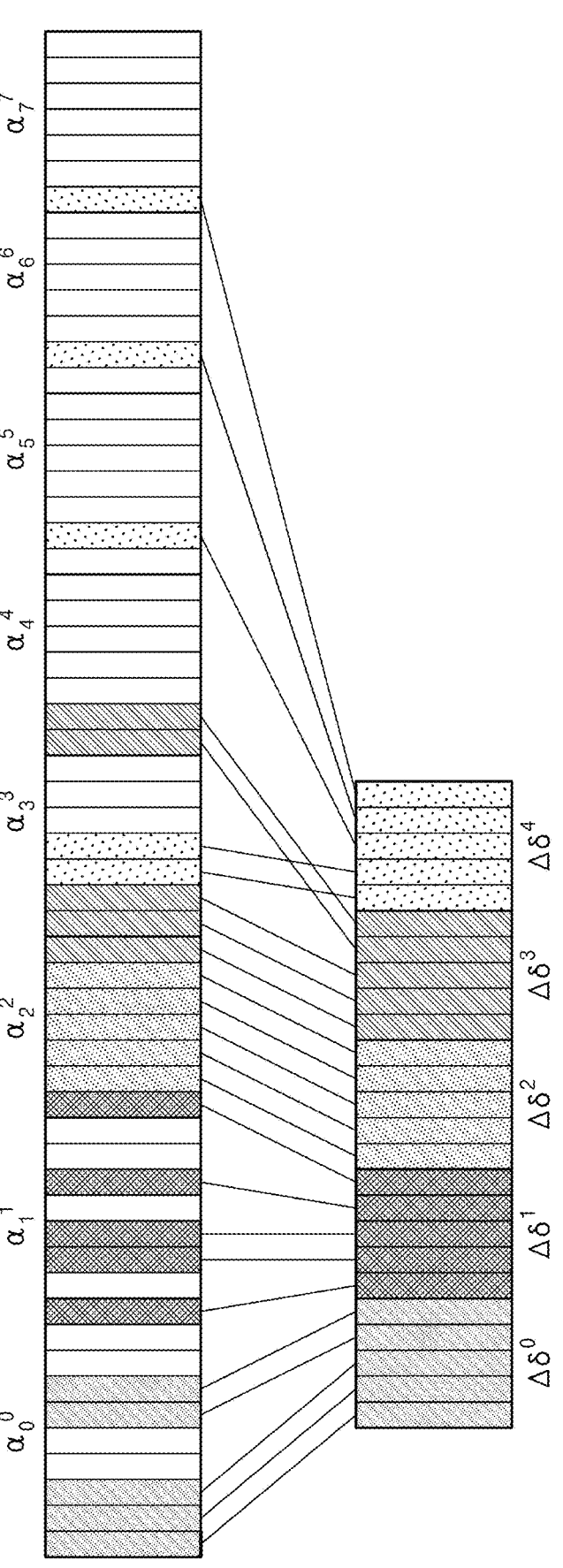

FIG. 10 is an example mapping between $$\alpha_0^M$$

and $\delta^{t_p}$ according to example embodiments.

Figure 11:
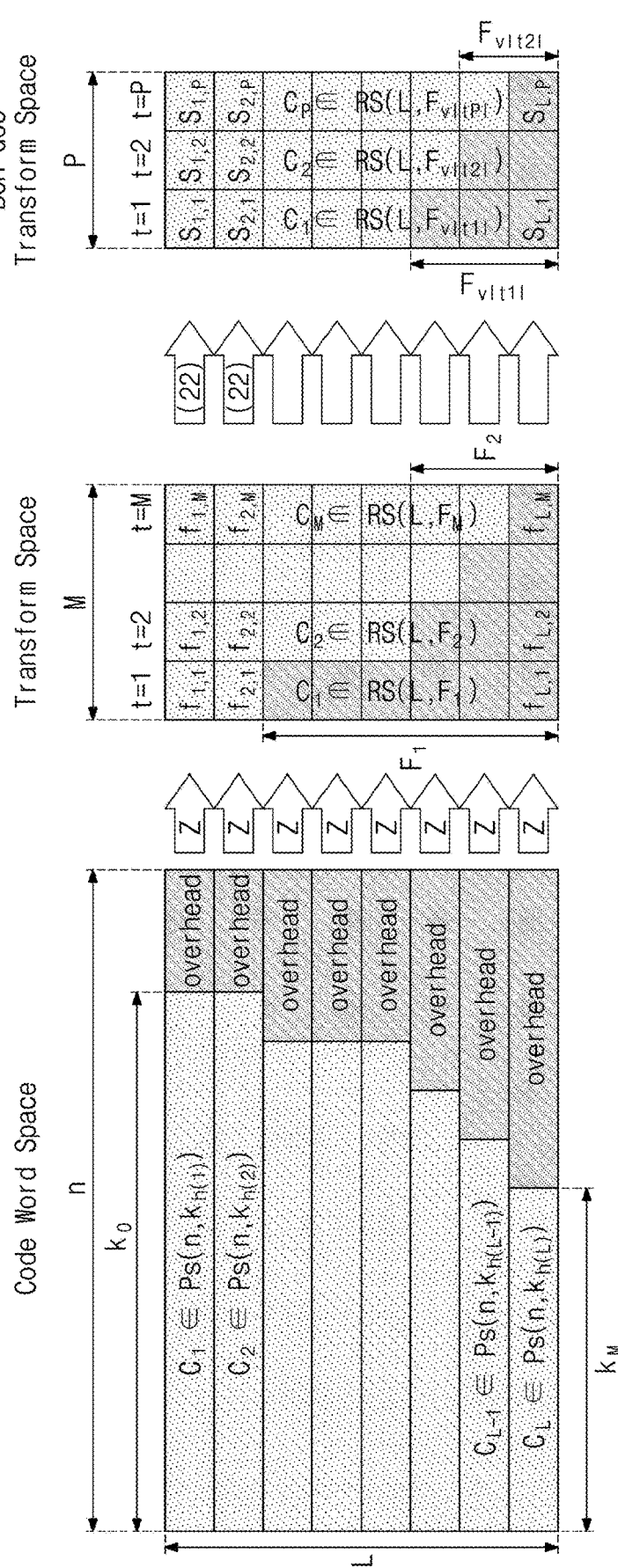

FIG. 11 is an example of an effective BCH-GCC decoder according to example embodiments.

Figure 12:
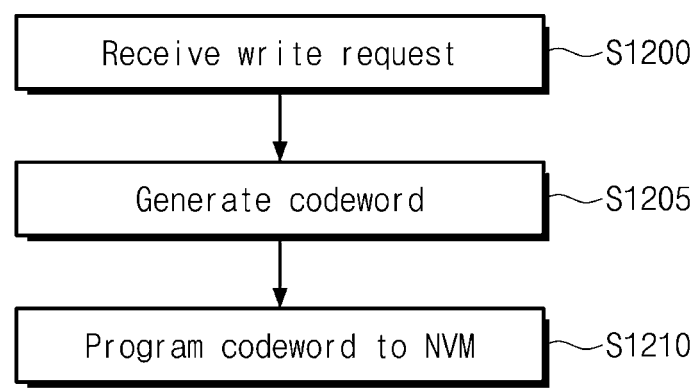

FIG. 12 is an example method for performing a write operation according to example embodiments.

Figure 13:
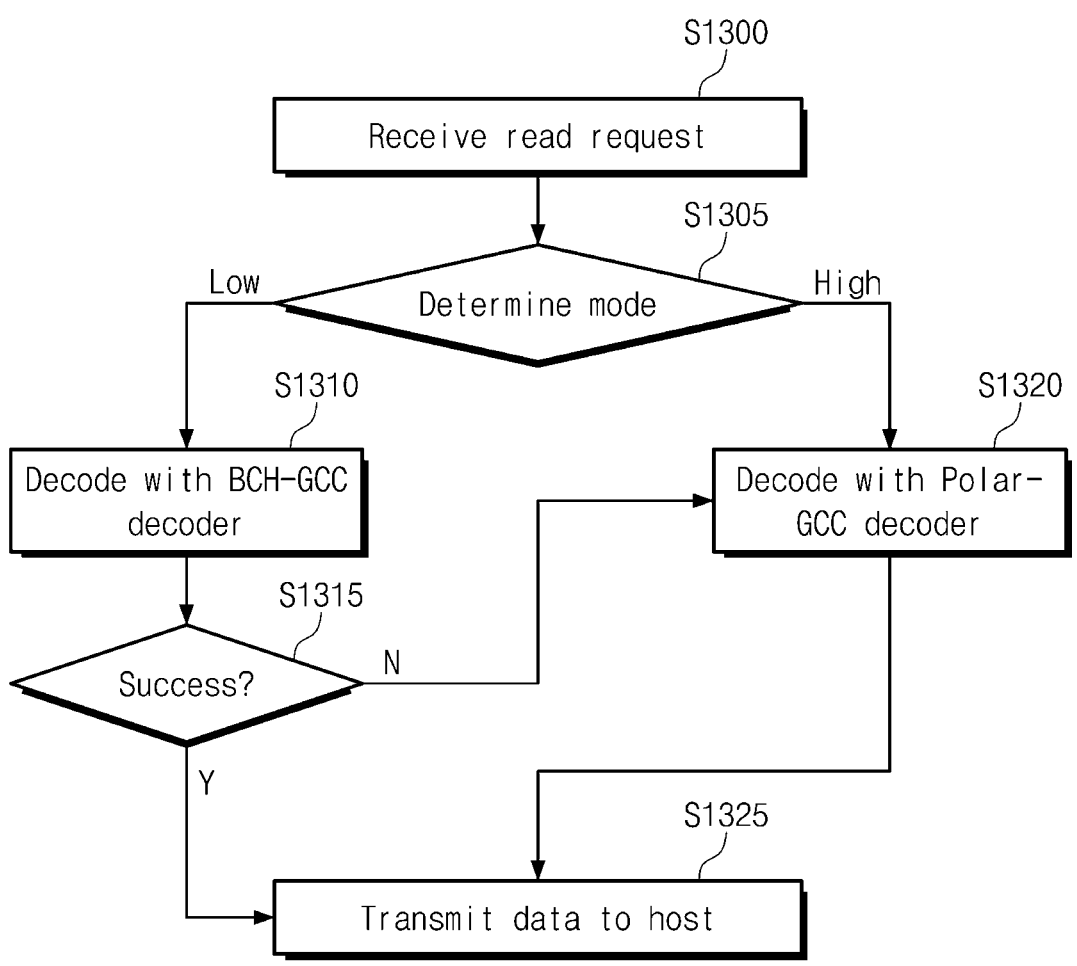

FIG. 13 is an example method for performing a read operation according to example embodiments.

Figure 14:
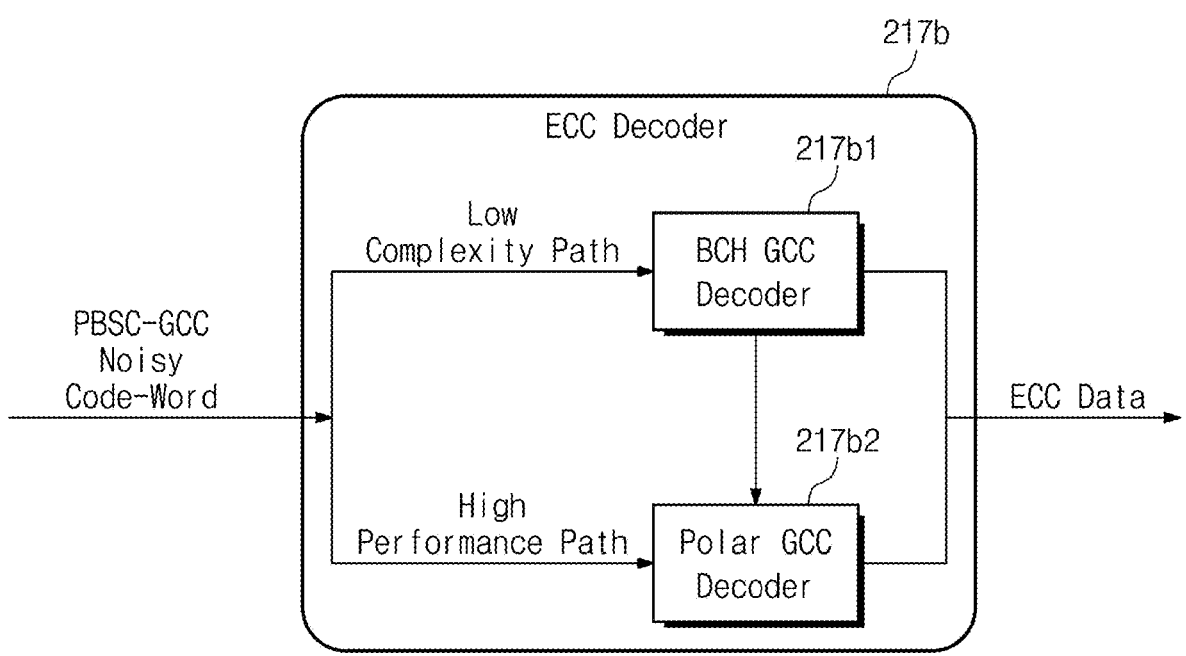

FIG. 14 is a block diagram of an example of an ECC decoder 217*b* according to example embodiments.

Figure 15:
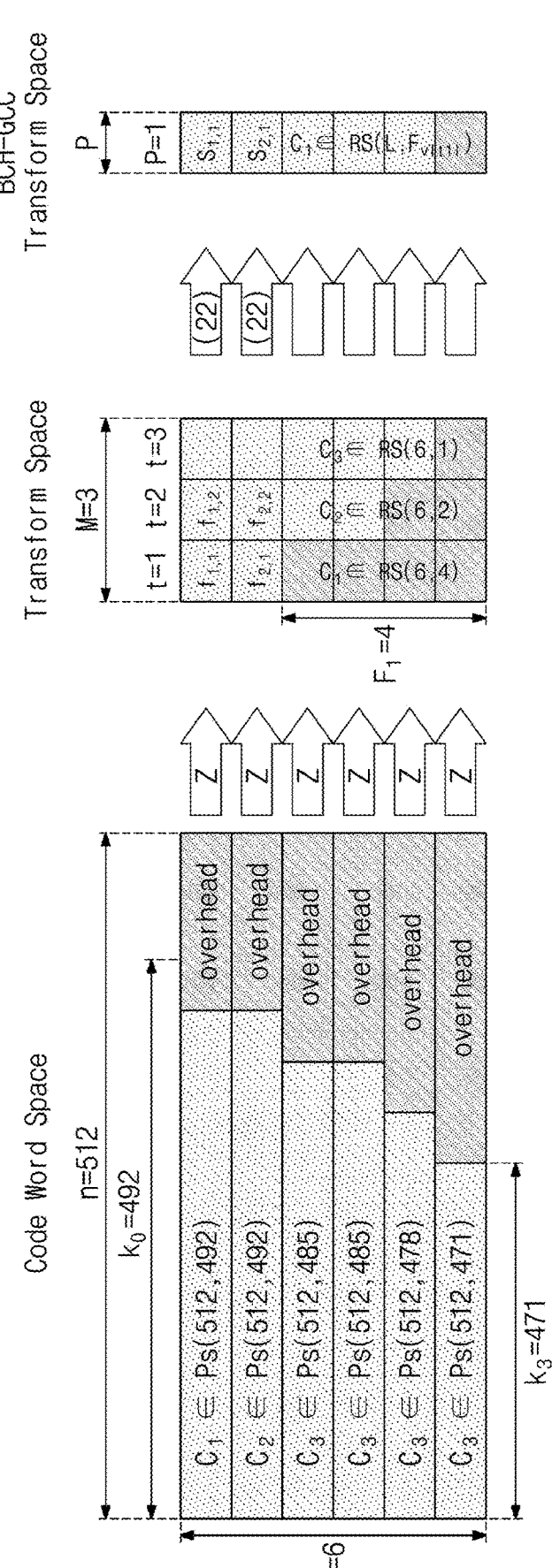

FIG. 15 is a schematic representation of the PBSC-GCC code, according to example embodiments, with example parameter definitions.

FIGS. 16A and 16B are examples of an example D matrix according to example embodiments.

FIG. 16C is an example of D matrix parameters according to example embodiments.

Figure 17:
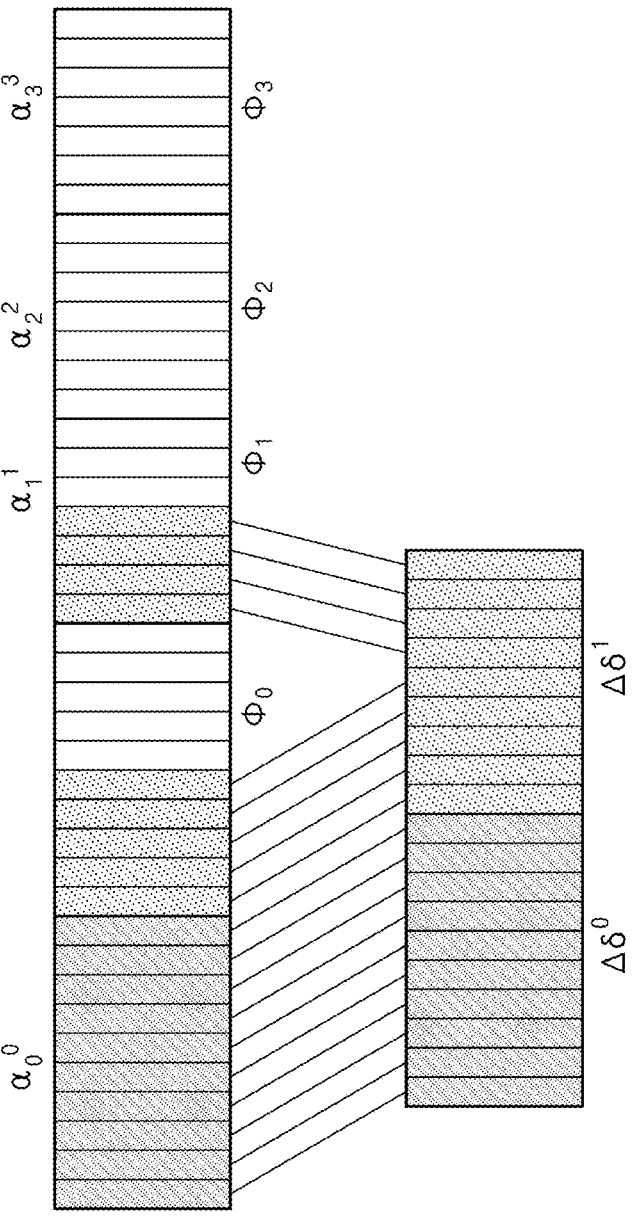

FIG. 17 shows a relation between the static and dynamic frozen bits according to an example.

FIGS. 18A-18C are an example of a PBSC-GCC decoder operation according to example embodiments.

Figure 19:
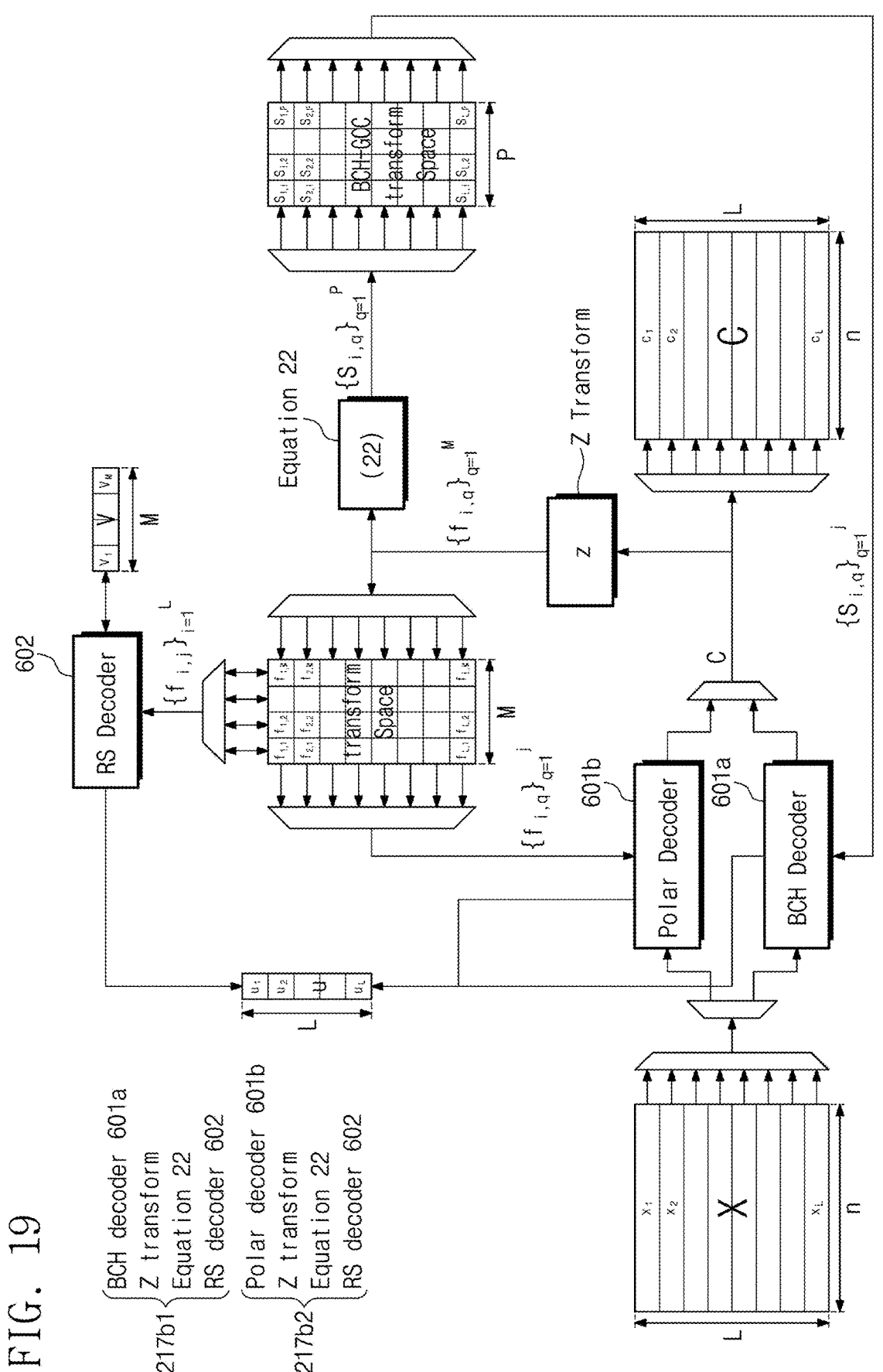

FIG. 19 is a block diagram illustrating an example method for performing a read operation according to example embodiments.

DETAILED DESCRIPTION

Below, some example embodiments of the inventive concepts will be described in detail and clearly to such an extent that one skilled in the art easily carries out the inventive concepts. In the following description, specific details such as detailed components and structures are merely provided to assist the overall understanding of some example embodiments of the inventive concepts. Therefore, it should be apparent to those skilled in the art that various changes and modifications of the example embodiments described herein may be made without departing from the scope and spirit of the inventive concepts. In addition, the descriptions of well-known functions and structures are omitted for clarity and brevity. In the following drawings or in the detailed description, components may be connected with any other components except for components illustrated in a drawing or described in the detailed description. The terms described in the specification are terms defined in consideration of the functions in the inventive concepts and are not limited to a specific function. The definitions of the terms should be determined based on the contents throughout the specification.

In the detailed description, components that are described with reference to the terms "driver", "block", "unit", etc. will be implemented with software, hardware, or a combination thereof. For example, the software may be a machine code, firmware, an embedded code, and application software. For example, the hardware may include an electrical circuit, an electronic circuit, a processor, a computer, integrated circuit cores, a pressure sensor, an inertial sensor, a micro electro mechanical system (MEMS), a passive element, or a combination thereof.

NAND memory devices strive to achieve high read throughput and low latency with low power consumption and low complexity. In order to achieve these goals, a minimal number of reads from the NAND is performed such that a single bit from the NAND channel is measured per bit that is written, which results in a hard decision (HD) binary channel.

Effective error correction codes (ECCs) for HD channels with good performance and low complexity are algebraic codes, such as Bose-Chaudhuri-Hocquenghem (BCH), Reed-Solomon (RS) and BCH-generalized concatenated codes (GCC).

If the HD decoding fails, it may be possible to read additional data from the NAND and receive additional soft information via a soft definition (SD) channel. This mode of operation is rare, and therefore, may be done with higher latency and complexity and requires high decoding capabilities.

For example, polar codes may be effective ECCs for SD channels with high decoding capabilities. However, polar codes require very high complexity and latency. In order to overcome the high complexity and latency, Polar-GCC codes can be used.

Some example embodiments of the present application include a construction of an ECC of the form of GCC with components of Polar-BCH sub-codes (e.g., a combination of polar codes and BCH codes) concatenated with RS codes. This family of codes, according to some example embodiments, exploits the benefits of BCH-GCC with low complexity decoders and excellent performance for HD channels, and also exploits the benefits of Polar-GCC with higher latency but good coverage for SD channels.

Figure 1:
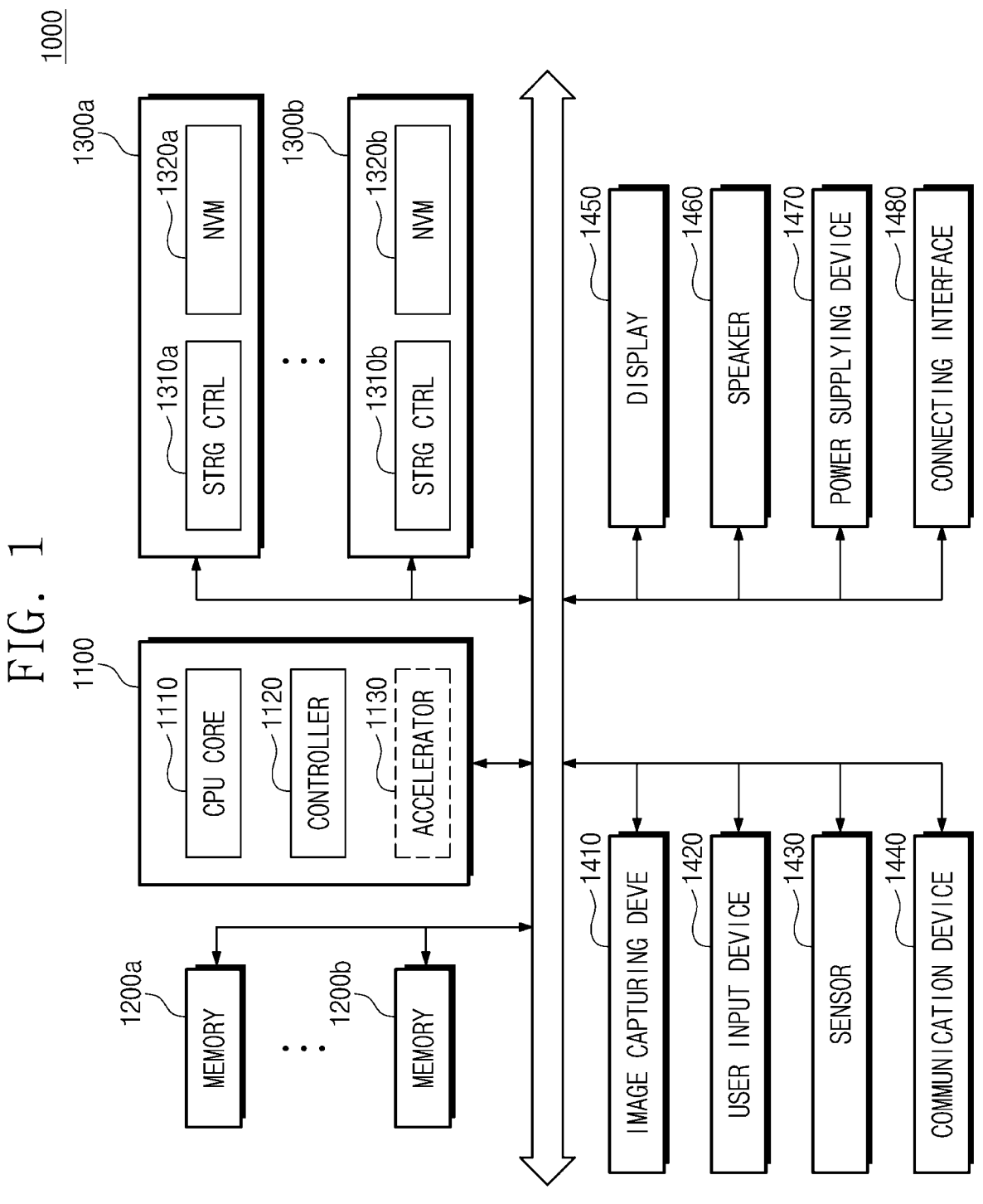
FIG. 1 is a diagram of a system 1000 to which a storage device is applied, according to example embodiments.

FIG. 1 is a diagram of a system 1000 to which a storage device is applied, according to example embodiments. The system 1000 of FIG. 1 may basically be a mobile system, such as a portable communication terminal (e.g., a mobile phone), a smartphone, a tablet personal computer (PC), a wearable device, a healthcare device, or an Internet of things (IoT) device. However, the system 1000 of FIG. 1 is not necessarily limited to the mobile system and may be a PC, a laptop computer, a server, a media player, or an automotive device (e.g., a navigation device).

Referring to FIG. 1, the system 1000 may include a main processor 1100, memories (e.g., 1200a and 1200b), and storage devices (e.g., 1300a and 1300b). In addition, the system 1000 may include at least one of an image capturing device 1410, a user input device 1420, a sensor 1430, a communication device 1440, a display 1450, a speaker 1460, a power supplying device 1470, and/or a connecting interface 1480.

The main processor 1100 may control all operations of the system 1000, more specifically, operations of other components included in the system 1000. The main processor 1100 may be implemented as a general-purpose processor, a dedicated processor, and/or an application processor.

The main processor 1100 may include at least one CPU core 1110 and further include a controller 1120 configured to control the memories 1200a and 1200b and/or the storage devices 1300a and 1300b. In some example embodiments, the main processor 1100 may further include an accelerator 1130, which is a dedicated circuit for a high-speed data operation, such as an artificial intelligence (AI) data operation. The accelerator 1130 may include a graphics processing unit (GPU), a neural processing unit (NPU) and/or a data processing unit (DPU) and be implemented as a chip that is physically separate from the other components of the main processor 1100.

The memories 1200a and 1200b may be used as main memory devices of the system 1000. Although each (or one or more) of the memories 1200a and 1200b may include a volatile memory, such as static random access memory (SRAM) and/or dynamic RAM (DRAM), each (or one or more) of the memories 1200a and 1200b may include non-volatile memory, such as a flash memory, phase-change RAM (PRAM) and/or resistive RAM (RRAM). The memories 1200a and 1200b may be implemented in the same package as the main processor 1100.

The storage devices 1300a and 1300b may serve as non-volatile storage devices configured to store data regardless of whether power is supplied thereto, and have larger storage capacity than the memories 1200a and 1200b. The storage devices 1300a and 1300b may respectively include storage controllers (STRG CTRL) 1310a and 1310b and NVM (Non-Volatile Memory) s 1320a and 1320b configured to store data via the control of the storage controllers 1310a and 1310b. Although the NVMs 1320a and 1320b may include flash memories having a two-dimensional (2D) structure or a three-dimensional (3D) V-NAND structure, the NVMs 1320a and 1320b may include other types of NVMs, such as PRAM and/or RRAM.

The storage devices 1300a and 1300b may be physically separated from the main processor 1100 and included in the system 1000 or implemented in the same package as the main processor 1100. In addition, the storage devices 1300a and 1300b may have types of solid-state devices (SSDs) or memory cards and be removably combined with other components of the system 100 through an interface, such as the connecting interface 1480 that will be described below. The storage devices 1300a and 1300b may be devices to which a standard protocol, such as a universal flash storage (UFS), an embedded multi-media card (eMMC), or a non-volatile memory express (NVMe), is applied, without being limited thereto.

The image capturing device 1410 may capture still images or moving images. The image capturing device 1410 may include a camera, a camcorder, and/or a webcam.

The user input device 1420 may receive various types of data input by a user of the system 1000 and include a touch pad, a keypad, a keyboard, a mouse, and/or a microphone.

The sensor 1430 may detect various types of physical quantities, which may be obtained from the outside of the system 1000, and convert the detected physical quantities into electric signals. The sensor 1430 may include a temperature sensor, a pressure sensor, an illuminance sensor, a position sensor, an acceleration sensor, a biosensor, and/or a gyroscope sensor.

The communication device 1440 may transmit and receive signals between other devices outside the system 1000 according to various communication protocols. The communication device 1440 may include an antenna, a transceiver, and/or a modem.

The display 1450 and the speaker 1460 may serve as output devices configured to respectively output visual information and auditory information to the user of the system 1000.

The power supplying device 1470 may appropriately convert power supplied from a battery (not shown) embedded in the system 1000 and/or an external power source, and supply the converted power to each of components of the system 1000.

The connecting interface 1480 may provide connection between the system 1000 and an external device, which is connected to the system 1000 and capable of transmitting and receiving data to and from the system 1000. The connecting interface 1480 may be implemented by using various interface schemes, such as advanced technology attachment (ATA), serial ATA (SATA), external SATA (e-SATA), small computer small interface (SCSI), serial attached SCSI (SAS), peripheral component interconnection (PCI), PCI express (PCIe), NVMe, IEEE 1394, a universal serial bus (USB) interface, a secure digital (SD) card interface, a multi-media card (MMC) interface, an eMMC interface, a UFS interface, an embedded UFS (eUFS) interface, and a compact flash (CF) card interface.

Figure 2A:
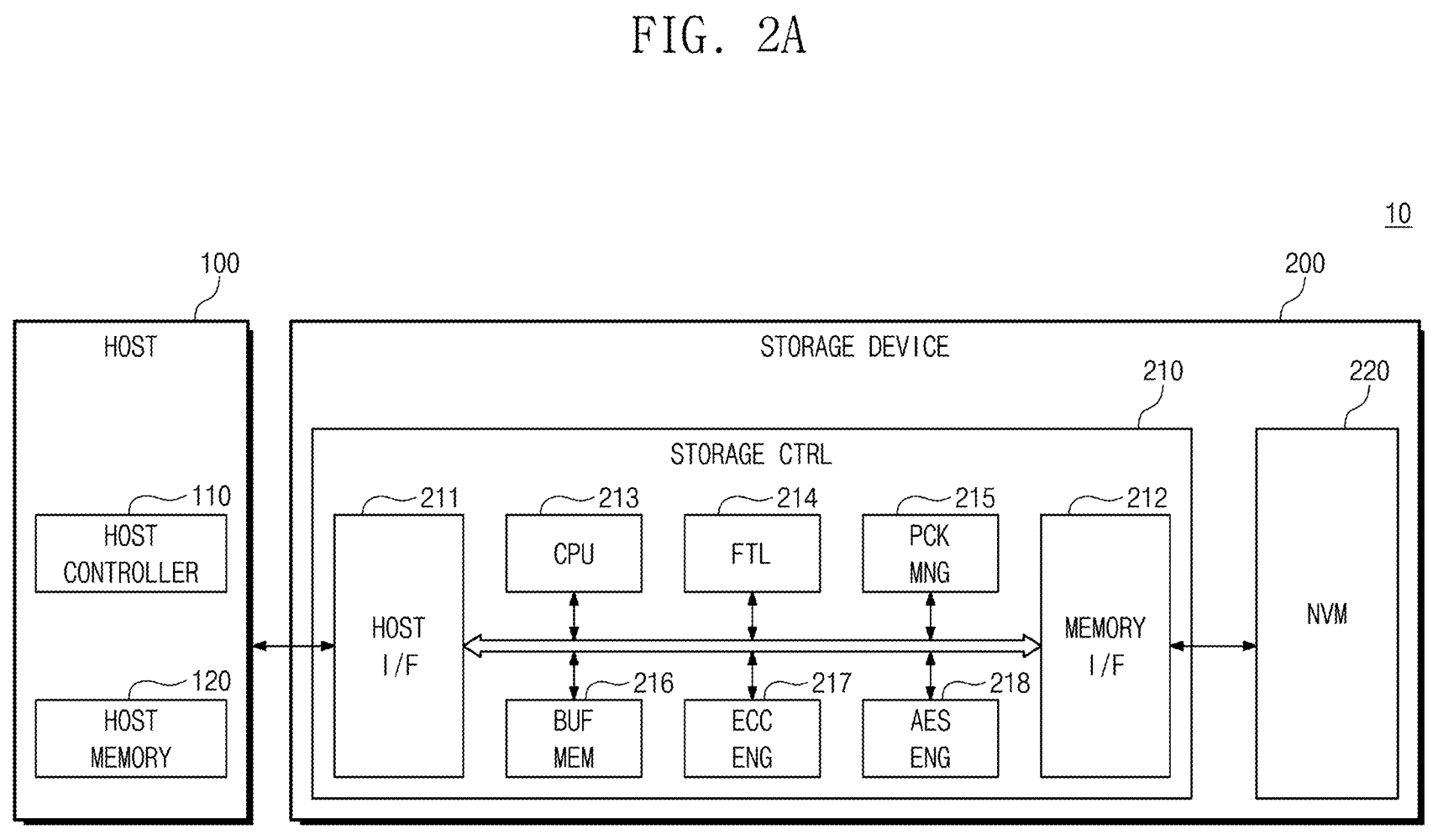

FIG. 2A is a block diagram of a host storage system 10 according to some example embodiments.

The host storage system 10 may include a host 100 and a storage device 200. For example, the host 100 may be the main processor 1100 and the storage device 200 may be the storage devices 1300a and/or 1300b, as shown in FIG. 1. Further, the storage device 200 may include a storage controller 210 and an NVM 220. According to some example embodiments, the host 100 may include a host controller 110 and a host memory 120. The host memory 120 may serve as a buffer memory configured to temporarily store data to be transmitted to the storage device 200 or data received from the storage device 200.

The storage device 200 may include storage media configured to store data in response to requests from the host 100. As an example, the storage device 200 may include at least one of an SSD, an embedded memory, and/or a removable external memory. When the storage device 200 is an SSD, the storage device 200 may be a device that conforms to an NVMe standard. When the storage device 200 is an embedded memory or an external memory, the storage device 200 may be a device that conforms to a UFS standard or an eMMC standard. Each of the host 100 and the storage device 200 may generate a packet according to an adopted standard protocol and transmit the packet.

When the NVM 220 of the storage device 200 includes a flash memory, the flash memory may include a 2D NAND memory array or a 3D (or vertical) NAND (VNAND) memory array. As another example, the storage device 200 may include various other kinds of NVMs. For example, the storage device 200 may include magnetic RAM (MRAM), spin-transfer torque MRAM, conductive bridging RAM (CBRAM), ferroelectric RAM (FRAM), PRAM, RRAM, and various other kinds of memories.

According to some example embodiments, the host controller 110 and the host memory 120 may be implemented as separate semiconductor chips. Alternatively, in some example embodiments, the host controller 110 and the host memory 120 may be integrated in the same semiconductor chip. As an example, the host controller 110 may be any one of a plurality of modules included in an application processor (AP). The AP may be implemented as a System on Chip (SoC). Further, the host memory 120 may be an embedded memory included in the AP or an NVM or memory module located outside the AP.

The host controller 110 may manage an operation of storing data (e.g., write data) of a buffer region of the host memory 120 in the NVM 220 or an operation of storing data (e.g., read data) of the NVM 220 in the buffer region.

The storage controller 210 may include a host interface 211, a memory interface 212, and a CPU 213. Further, the storage controllers 210 may further include a flash translation layer (FTL) 214, a packet manager 215, a buffer memory 216, an error correction code (ECC) engine 217, and an advanced encryption standard (AES) engine 218. The storage controllers 210 may further include a working memory (not shown) in which the FTL 214 is loaded. The CPU 213 may execute the FTL 214 to control data write and read operations on the NVM 220.

The host interface 211 may transmit and receive packets to and from the host 100. A packet transmitted from the host 100 to the host interface 211 may include a command or data to be written to the NVM 220. A packet transmitted from the host interface 211 to the host 100 may include a response to the command or data read from the NVM 220. The memory interface 212 may transmit data to be written to the NVM 220 to the NVM 220 or receive data read from the NVM 220. The memory interface 212 may be configured to comply with a standard protocol, such as Toggle or open NAND flash interface (ONFI).

The FTL 214 may perform various functions, such as an address mapping operation, a wear-leveling operation, and a garbage collection operation. The address mapping operation may be an operation of converting a logical address received from the host 100 into a physical address used to actually store data in the NVM 220. The wear-leveling operation may be a technique for preventing excessive deterioration of a specific block by allowing blocks of the NVM 220 to be uniformly used. As an example, the wear-leveling operation may be implemented using a firmware technique that balances erase counts of physical blocks. The garbage collection operation may be a technique for ensuring usable capacity in the NVM 220 by erasing an existing block after copying valid data of the existing block to a new block.

The packet manager 215 may generate a packet according to a protocol of an interface, which consents to the host 100, or parse various types of information from the packet received from the host 100. In addition, the buffer memory 216 may temporarily store data to be written to the NVM 220 or data to be read from the NVM 220. Although the buffer memory 216 may be a component included in the storage controllers 210, the buffer memory 216 may be outside the storage controllers 210.

The ECC engine 217 may perform error detection and correction operations on read data read from the NVM 220. More specifically, the ECC engine 217 may generate parity bits for write data to be written to the NVM 220, and the generated parity bits may be stored in the NVM 220 together with write data. During the reading of data from the NVM 220, the ECC engine 217 may correct an error in the read data by using the parity bits read from the NVM 220 along with the read data, and output error-corrected read data.

The AES engine 218 may perform at least one of an encryption operation and a decryption operation on data input to the storage controllers 210 by using a symmetric-key algorithm.

Figure 2B:
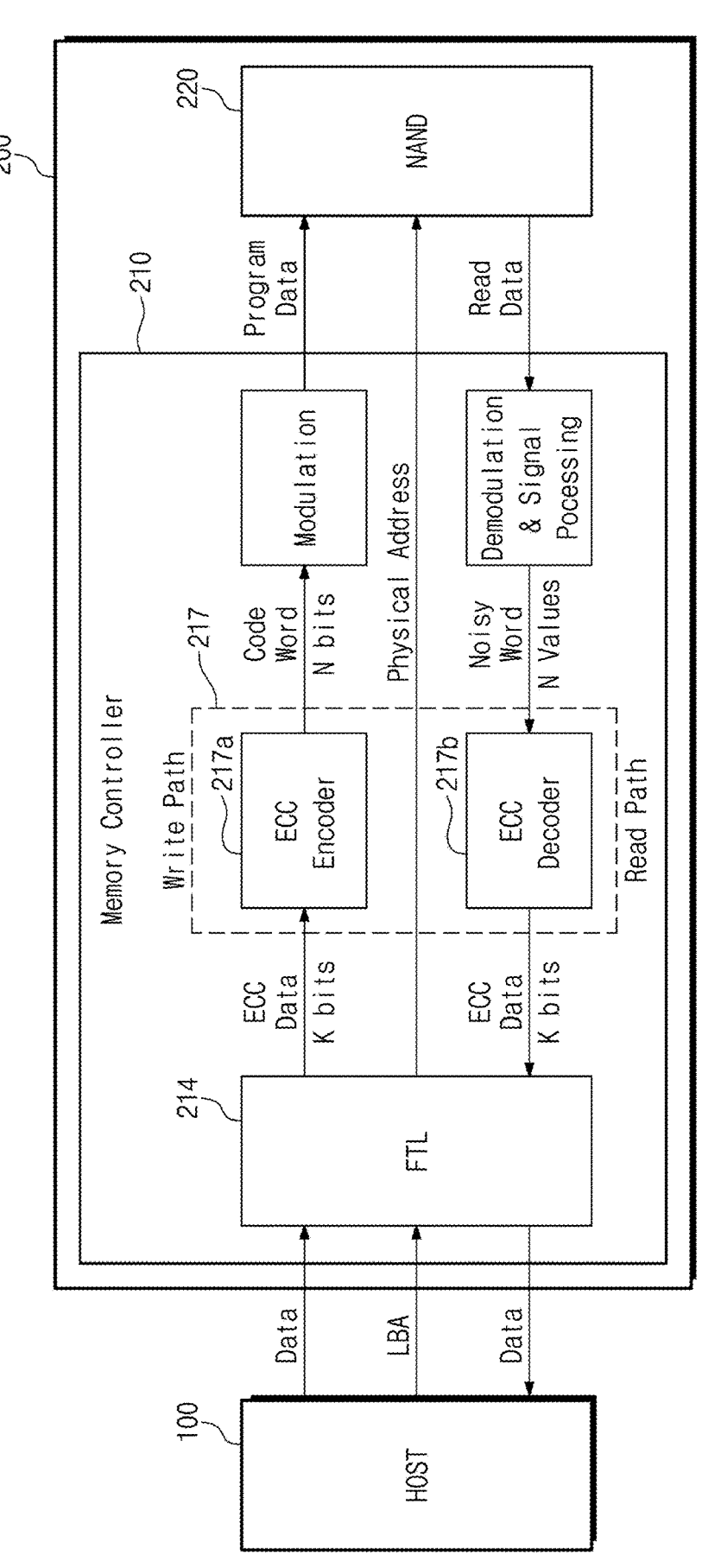
FIG. 2B is a schematic illustration of an error correction operation in a storage system.

FIG. 2B is a schematic illustration of an error correction operation in a storage system.

Referring to FIG. 2B, in order to write data to the NVM 220, the host 100 transmits a logical address (LBA—Logic Block Address) and data to the memory controller 210. The FTL 214 of the memory controller 210 breaks the data to ECC data words and sets a corresponding physical addresses for the NVM 220.

An ECC data word length may be denoted as K. K may be 4 KB. However, example embodiments are not limited thereto and K may be a different size. The ECC engine 217 receives the K bits from the FTL 214 and adds redundancy bits using an ECC encoder 217a, generating ECC code words of length N. The ECC code rate may be equal to $$R = \frac{K}{N}.$$

R may be equal to 0.9, however example embodiments are not limited thereto.

The N bit code words are then merged together and programmed on the NVM 220 device, using modulations. For example, SLC, MLC, TLC, and/or QLC modulations may be used.

To read data from the NVM 220, the host 100 transmits a request to the memory controller 210 to read the LBA. The request is translated by the FTL 214 to physical addresses. The NVM 220 transfers the corresponding read data which is demodulated and processed to generate ECC noisy words of length N.

The basic mode of operation is a fast read from the NVM 220. In the fast read, the memory controller 210 receives N bits from the NVM 220, which is the ECC code word with some possible errors. The ECC engine decodes the N bits with errors and generates the stored K bits ECC data, using an ECC decoder 217b. The fast read mode may be referred as HD (Hard Decision) mode or HD channel.

If the ECC engine 217 is not able to successfully decode the ECC code word to the K bits of ECC data, it may be possible to receive additional measurements from the NVM device 220. For example, the ECC engine 217 may receive a vector of N "soft" values, representing the ECC code word, and the ECC decoder 217a may perform ECC decoding on the vectors of soft values using a more complex decoder. This mode may be referred to as SD (Soft Decision) mode or SD channel. SD channel requires higher latency, because of the read time from the NVM 220 and because the ECC mode of operations may be done with higher complexity.

As used herein, we use the definition $[n] \triangleq [1, 2, \ldots n]$ and $[n]^* = [0,1,2, \ldots n]$. Vectors are represented as small letters with bold v and matrices as large letters with bold A. A Kronecker product between the N×M A matrix and B matrix is defined as $$A \otimes B \triangleq \begin{bmatrix} a_{11} \cdot B & a_{12} \cdot B & a_{1M} \cdot B \\ a_{21} \cdot B & a_{22} \cdot B & a_{2M} \cdot B \\ a_{N1} \cdot B & a_{N2} \cdot B & a_{NM} \cdot B \end{bmatrix}.$$

An N×N identity matrix is marked as $I_N$. $u_\phi$ marks the subset of the vector u (of size n) located at indices $\phi \subseteq [n]$. $D_\phi$ mark the subset of the matrix D (with n rows) located at rows $\phi \subseteq [n]$.

Table 1 includes code specific abbreviations and definitions used herein.

TABLE 1

| G | Polar Generator Matrix |
|---|---|
| $\phi_t$ | polar static frozen set at stage t |
| $P_t$ | Polar transform corresponding to $\phi_t$ |
| $P(n, k, \phi)$ | Polar code of length n, dimension k, and static frozen set $\phi$ |
| $\phi_i^j$ | union of polar static frozen set up to stage $j$: $\phi_i^j \triangleq U_{t=i}^j \phi_t$ |
| $\alpha$ | Galois Field primitive element |
| $BCH(n, k, t)$ | BCH code of length n, dimension k, and error correction capability t |
| $B_t$ | BCH transform corresponding to stage t |
| $RS(n, F)$ | RS code of length n (symbols), and $F = d_{min} - 1$ |
| $R_t$ | RS transform corresponding to stage t polar sub-code dynamic frozen set at stage t |
| $\alpha_t$ | polar sub-code static and dynamic frozen set at stage t: $\alpha_t = \phi_t \cup \delta_t$ |
| $Z_t$ | Polar subcode transform corresponding to $\alpha_t$ |
| $Ps(n, k, \alpha)$ | Polar sub-code code of length n, dimension k, and static and dynamic frozen set $\alpha$ |

In some example embodiments, nested codes may be used as constituent codes of an ECC. As used herein, nested codes are defined as codes from the same family: $\mathbb{Q}_M \subset \mathbb{Q}_{M-1} \subset \ldots \subset \mathbb{Q}_1$, where code $\mathbb{Q}_j$ has length n and dimension $k_j$, where $k_{j_1} \geq k_{j_2}$ for $j_1 < j_2$ and $j_1, j_2 \in [M]$.

Define a codeword word c in $\mathbb{Q}_{j_1}$ ($c \in \mathbb{Q}_{j_1}$) and define the coset $s \in \{0.2\}$ $$s \in \{0, 1\}^{k_{j_1} - k_{j_2}} (j_1 < j_2).$$

$(j_1 < j_2)$. The nested codes have the property that the codewords c in $\mathbb{Q}_{j_2}$ ($c \in \mathbb{Q}_{j_2}$) are the codewords in $\mathbb{Q}_{j_1}$, which meet the linear constrain $T_{j_1 \to j_2} \cdot c = s_{j_1 \to j_2}$, where $T_{j_1 \to j_2} \in \{0,1\}$ $$T_{j_1 \to j_2} \in \{0, 1\}^{(k_{j_1} - k_{j_2}) \times n}$$

$x^n$ is the coset operator. Notice the number of code words in $\mathbb{Q}_{j_2}$ is the number of codewords in $\mathbb{Q}_{j_1}$ but reduced by a factor of $$2^{k_{j_1} - k_{j_2}},$$

resulting in dimension reduction from $k_{j_1}$ to $k_{j_2}$.

The transform is defined as a linear operation T applied on a constituent code word c, $c \in \{0,1\}^n$ and returning the side information of the code word, $s \in \{0,1\}^{k_0 - k_M}$ which is defined as the Transform Space: $s = T \cdot c$, where $$T \triangleq \begin{bmatrix} T_{1 \to 2} \\ T_{2 \to 3} \\ \dots \\ \dots \\ T_{M-1 \to M} \end{bmatrix}.$$

Example of constituent (e.g., nested) codes include Polar codes, BCH codes, and RS codes. Examples of transformations for each of Polar codes, BCH codes, and RS codes are described below.

A polar codeword $c \in \{0,1\}^n$ is defined through a polar transform matrix G and frozen space $u \in \{0,1\}^n$ such that $c = G \cdot u$. The matrix G is invertible, and $u = G^{-1} \cdot c$.

Some of the bits of a polar codeword, at locations $\phi \subset [n]$ in u are known, and called frozen. The number of frozen bits, $|\phi|$ defines the code overhead, such that the dimension of the polar code is $k = n - |\phi|$. The polar code of length n, and dimension k is defined as $P(n,k,\phi)$, where $c \in P(n,k,\phi)$.

The disjoint sets of frozen bits are defined as $\phi_t \subset [n]$, $t \in [M]^*$, $\phi_{t_1} \cap \phi_{t_2} = \emptyset \forall t_1 \neq t_2$ and the frozen set is defined as $$\phi_0^j \triangleq \bigcup_{t=0}^j \phi_t.$$

The corresponding nested polar codes are defined as $$P(n, k_j, \phi_0^j), \; j \in [M]^*,$$

with their corresponding dimension $$k_j = n - |\phi_0^j|,$$

as shown in Equation 1.

$$P(n, k_M, \phi_0^M) \subset P(n, k_{M-1}, \phi_0^{M-1}) \subset \dots \subset \qquad \text{Equation 1}$$
$$P(n, k_1, \phi_0^1) \subset P(n, k_0, \phi_0^0)$$

can be used to define the Polar family of nested codes. The matrix $U_\phi$, a $|\phi|$ over n matrix, that selects from a vector of length n, the locations $\phi \subset [n]$ and the corresponding transform $P_\phi$: $P_\phi \triangleq U_\phi \cdot G^{-1}$.

The transform of the nested code is defined with the matrices $P_{\phi_t}$: the notation $P_t \triangleq P_{\phi_t}$ will be used herein for shorter expressions.

The transform space includes the $|\phi_t|$ bits, symbols $s_t$, as follows: $s_t = P_t \cdot c$, $t \in [M]$.

The transform space symbols of the code word c, for the Polar family of nested codes, is shown in Equation 2.

$$s \triangleq \begin{bmatrix} s_1 \\ s_2 \\ \dots \\ s_M \end{bmatrix} = \begin{bmatrix} P_1 \\ P_2 \\ \dots \\ P_M \end{bmatrix} \cdot c \triangleq P \cdot c \qquad \text{Equation 2}$$

BCH codes may be expressed as BCH(n,k,t) and defined over the Galois field $GF(2^m)$ as a BCH code of length n ($n \leq 2^m - 1$), dimension k (typically $k = n - m \cdot t$), and error correction capability t. The parity check matrix of such a BCH code may be defined with the primitive element $\alpha$ as shown in Equation 3.

$$H_t \triangleq \begin{bmatrix} 1 & \alpha & \alpha^2 & \alpha^3 & \dots & \alpha^{n-1} \\ 1 & \alpha^3 & \alpha^6 & \alpha^9 & \dots & \alpha^{3 \cdot (n-1)} \\ 1 & \alpha^5 & \alpha^{10} & \alpha^{15} & \dots & \alpha^{5 \cdot (n-1)} \\ \dots & \dots & \dots & \dots & & \dots \\ 1 & \alpha^{2t-3} & \alpha^{4t-6} & \alpha^{6t-9} & \dots & \alpha^{(2t-3) \cdot (n-1)} \\ 1 & \alpha^{2t-1} & \alpha^{4t-2} & \alpha^{6t-3} & \dots & \alpha^{(2t-1) \cdot (n-1)} \end{bmatrix} \qquad \text{Equation 3}$$

A set of error corrections parameters $t_j$ is defined as $j \in [M]^*$ such that $t_j \leq t_r \forall j < r$, with the corresponding dimension $k_j$, and the BCH nested codes, as shown in Equation 4.

$$BCH(n, k_M, t_M) \subset BCH(n, k_{M-1}, t_{M-1}) \subset \dots \subset BCH(n, k_0, t_0) \qquad \text{Equation 4}$$

$BCH(n, k_{0 \to M}, t_{0 \to M})$ can be used to define this family of nested codes as follows.

For some j, the BCH code $t_{j-1} \to t_j$ coset is defined with $H_{t_{j-1} \to t_j}$ as shown in Equation 5.

$$H_{t_{j-1} \to t_j} \triangleq \qquad \text{Equation 5}$$
$$\begin{bmatrix} 1 & \alpha^{2 \cdot t_{j-1}+1} & \alpha^{2 \cdot (2 \cdot t_{j-1}+1)} & \alpha^{3 \cdot (2 \cdot t_{j-1}+1)} & \dots & \alpha^{(n-1) \cdot (2 \cdot t_{j-1}+1)} \\ 1 & \alpha^{2 \cdot t_{j-1}+3} & \alpha^{2 \cdot (2 \cdot t_{j-1}+3)} & \alpha^{3 \cdot (2 \cdot t_{j-1}+3)} & \dots & \alpha^{(n-1) \cdot (2 \cdot t_{j-1}+3)} \\ \dots & \dots & \dots & \dots & \dots & \dots \\ 1 & \alpha^{2 \cdot t_j - 1} & \alpha^{2 \cdot (2 \cdot t_j - 1)} & \alpha^{3 \cdot (2 \cdot t_j - 1)} & \dots & \alpha^{(n-1) \cdot (2 \cdot t_j - 1)} \end{bmatrix}$$

The transform is then defined as $B_j \triangleq H_{t_{j-1} \to t_j}$, $j \in [M]$ with a corresponding transform space symbol being $s_j = B_j \cdot c$. The transform space of the BCH codes is therefore shown in Equation 6.

$$s \triangleq \begin{bmatrix} B_1 \\ B_2 \\ \dots \\ B_M \end{bmatrix} \cdot c \triangleq B \cdot c \qquad \text{Equation 6}$$

RS codes may be expressed as RS(n,f) of length n and minimum distance F+1. The parity check matrix of such a RS code may be defined with the primitive element $\alpha$ as shown in Equation 7.

$$H_F = \begin{bmatrix} 1 & 1 & 1 & 1 & \dots & 1 \\ 1 & \alpha & \alpha^2 & \alpha^3 & \dots & \alpha^{(n-1)} \\ 1 & \alpha^2 & \alpha^4 & \alpha^6 & \dots & \alpha^{2 \cdot (n-1)} \\ \dots & \dots & \dots & \dots & \dots & \dots \\ 1 & \alpha^{F-2} & \alpha^{2 \cdot (F-2)} & \alpha^{3 \cdot (F-2)} & \dots & \alpha^{(F-2) \cdot (n-1)} \\ 1 & \alpha^{F-1} & \alpha^{2 \cdot (F-1)} & \alpha^{3 \cdot (F-1)} & \dots & \alpha^{(F-1) \cdot (n-1)} \end{bmatrix} \qquad \text{Equation 7}$$

A set of error corrections parameters $F_t$, $t = 0, 1, 2, \dots$ M are defined such that $F_t \leq F_r \forall t < r$. The RF nested codes are therefore given as shown in Equation 8.

$$RS(n, F_M) \subset RS(n, F_{M-1}) \subset \dots \subset RS(n, F_0) \qquad \text{Equation 8}$$

$RS(n, F_{0 \to M})$ can therefore be used to define this family of nested codes. The RS code $F_t \to F_r$, $F_t \leq F_r$, coset is defined with the following matrix:

$$H_{F_t \to F_r} = \begin{bmatrix} 1 & \alpha^{F_t} & \alpha^{F_t} & \alpha^{F_t} & \ldots & \alpha^{F_t \cdot (n-1)} \\ \ldots & \ldots & \ldots & \ldots & \ldots & \ldots \\ 1 & \alpha^{F_r-2} & \alpha^{2 \cdot (F_r-2)} & \alpha^{3 \cdot (F_r-2)} & \ldots & \alpha^{(F_r-2) \cdot (n-1)} \\ 1 & \alpha^{F_r-1} & \alpha^{2 \cdot (F_r-1)} & \alpha^{3 \cdot (F_r-1)} & \ldots & \alpha^{(F_r-1) \cdot (n-1)} \end{bmatrix}.$$

The transform is then defined as shown in Equation 9.

$$R_t \triangleq H_{F_t \to F_{t+1}}, t \in [M] \qquad \text{Equation 9}$$

The corresponding transform space symbol is $s_t = R_t \cdot c$. The transform space of the SR codes is therefore shown in Equation 10.

$$s \triangleq \begin{bmatrix} R_1 \\ R_2 \\ \ldots \\ R_M \end{bmatrix} \cdot c \triangleq R \cdot c \qquad \text{Equation 10}$$

Polar sub-codes are an extension of polar codes. Polar sub-codes include static and dynamic frozen bits, both defined on the frozen space and generated using the polar transform, defined by the matrix $G$. The static frozen locations are in the indices $\phi \subset [n]$ and the dynamic frozen location are in $\delta \subset [n]$, where $\delta \cap \phi = \emptyset$. The static frozen $u_{\phi_i} = f_{\phi_i}$, where $f_{\phi_i} \in \{0,1\}$ are the values of the static bits and define the row vector $D_{\phi_i} = \hat{e}_{\phi_i}$ (where $\hat{e}_j$ is the unity vector of length n, with all zeros and 1 at index j), such that $D_{\phi_i} \cdot u = f_{\phi_i}$.

$f_{\phi_i}$ can therefore be seen as the coset value corresponding to the static frozen $\phi_i$ and $f_\phi$ as the coset values corresponding to the static frozen set $\phi$.

It can be seen that if a set of indices is defined as $J_{\delta_i} \subset [n]$, with the constrain that $j < \delta_i$, $\forall j \in \delta_i$, then the dynamic frozen, $u_{\delta_i}$ meets the equation $\sum_{j \in J_{\delta_i}} u_j + u_{\delta_i} = f_{\delta_i}$ where $f_{\delta_i}$ is the coset value corresponding to the dynamic frozen $\delta_i$ and defines the row vector $D_{\delta_i}$ such that $D_{\delta_i} \cdot u = f_{\delta_i}$.

If a polar sub-code is then defined as $Ps(n, k, \alpha)$ of length n, with a set of indices $\alpha = \phi \cup \delta$ and dimension $k = n - |\alpha|$, the corresponding equations are $D_\alpha \cdot u = f_\alpha$, where $D_\alpha$ is the concatenation of all row vectors $D_{\delta_i}$ and $D_{\phi_i}$, and $f_\alpha$ is the concatenation of all coset values $f_{\phi_i}$ and $f_{\delta_i}$ $$D_\alpha = \begin{bmatrix} D_{\alpha_1} \\ D_{\alpha_2} \\ \ldots \\ D_{\alpha_{|\delta \cup \phi|}} \end{bmatrix}, f_\alpha = \begin{bmatrix} f_{\alpha_1} \\ f_{\alpha_2} \\ \ldots \\ f_{\alpha_{|\delta \cup \phi|}} \end{bmatrix}.$$

The matrix D is defined only on the rows $\alpha$, and is not defined in the rows $[n] \backslash \alpha$.

A specific polar sub-codes implementation is Polar-BCH sub-codes, where the dynamic frozen bits are used such that the polar sub-codes are also BCH codes. Polar-BCH sub-codes may be described as follows.

Assume $H_t$ is the parity check matrix of a BCH(n,k,t) code, as defined in Equation 3. Then a polar sub-code word c has the property that $H_t \cdot c = 0$, such that the code word $c \in BCH(n, k, t)$. The code-word is also a polar code-word, thus $c = G \cdot u$, and it follows that $H_t \cdot G \cdot u = 0$.

$A^t \triangleq H_t \cdot G$ can then be defined such that $A^t \cdot u = 0$. Row operations may then be applied, represented by the matrix Q, on $A^t$ to form a matrix $Q \cdot A^t$ with gradual structure, which include typically m·t leading ones that are the maximal index in each row, which are defined as the dynamic frozen bits $$\delta^t = \{\delta_i^t\}_{i=1}^{m \cdot t}.$$

The m·t over n matrix $$D_{\delta^t}^t$$

may then be defined such that $$D_{\delta^t}^t \cdot u = f_{\delta^t}.$$

The matrix $$D_{\delta^t}^t$$

thus has the properties $$\forall j > \delta_i, D_{\delta_i^t, j}^t = 0, D_{\delta_i^t, \delta_i}^t = 1, \text{ and}$$

$$J_{\delta_i} \triangleq \{j \in [n] \big| D_{\delta_i^t, j}^t = 1, j < \delta_i \}.$$

Thus, equation 11 is satisfied.

$$\sum_{j \in J_{\delta_i}^t} D_{\delta_i^t, j}^t \cdot u_j + u_{\delta_i} = f_{\delta_i^t}, \ \forall i \in [m \cdot t] \qquad \text{Equation 11}$$

The Polar-BCH sub-codes frozen bits are defined as $\alpha^t = \delta^t \cup \phi$ and the matrix $D_{\alpha^t}$ defines the relation of the static and dynamic bits with their corresponding coset values as $D_{\alpha^t} \cdot u = f_{\alpha^t}$. The index t indicates that the polar subcode corresponds to a BCH code with correction capability t.

A Generalized Concatenated Code (GCC) is a code which includes several constituent codes belonging to a nested codes family, a transform to a transform space, and a list of codes in the transform space, with a mapping between the codes words and the transform symbols.

An example of a BCH-GCC is described below as a concatenation of BCH codes with RS codes.

Figure 3:
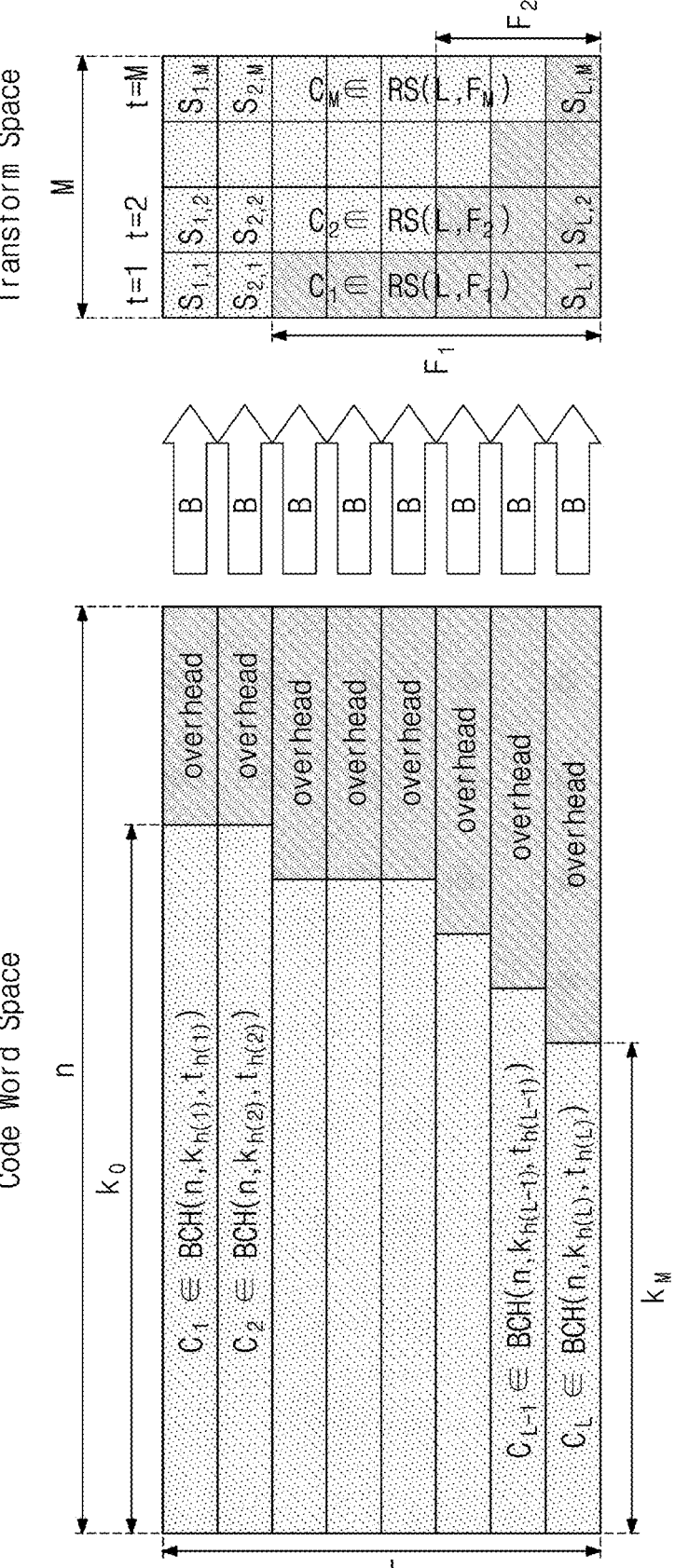
FIG. 3 is an example of a structure of a BCH-GCC.

An example of a structure of a BCH-GCC is shown in FIG. 3.

Assume that we have a set of nested BCH codes as defined in Equation 4. A number L of BCH code words may then be defined, each belonging to one of the nested codes, where $c_i \in BCH(n, k_{h(i)}, t_{h(i)})$, $i \in [L]$, of length n and dimension $k_{h(i)}$, where $k_{h(i)} \geq \ldots \geq k_{h(L)}$. The function h(i) maps the code word i to the corresponding polar nested code and h(1) = 0 and h(L) = M. L ≥ M, as there may be several polar code words belonging to the same polar code.

The [m·M]x[n] transform matrix B may then be defined according to Equation 12.

$$B \triangleq \begin{bmatrix} B_1 \\ B_2 \\ \dots \\ B_M \end{bmatrix} \qquad \text{Equation 12}$$

The corresponding transform space symbols are defined as $s_{i,t}=B_t \cdot c_i$ for $\forall t \in [M]$ and $\forall i \in [L]$.

Next, for all $t \in [M]$, the vector of symbols $[s_{i=1,t}, s_{i=2,t}, \dots s_{i=L,t}]^T$ are defined, as a RS code word $C_t \in RS(L, F_t)$ of length L and dimension $K_t$, where $K_1 \leq K_2 \dots \leq K_M$, or equivalently with $F_1 \geq F_2 \dots \geq F_M$, where $0 \leq F_t \leq L$.

The resulting structure of the BCH-GCC is shown in FIG. 3.

Referring to FIG. 3, there is a direct relation between $$\{k_{f(i)}\}_{i=1}^L \text{ and } \{F_t\}_{t=1}^M,$$

where $F_t$ is equal to the number of rows with dimension smaller then $k_0 - t \cdot m$, as described in Equation 13.

$$F_t = |\{i | k_{h(i)} < k_0 - t \cdot m\}| \qquad \text{Equation 13}$$

The BCH-GCC code is defined according to Equation 14.

$$GCC \left( L, M, n, k_0, \{F_t\}_{t=1}^M, BCH(n, k_{0 \to M}, t_{0 \to M}) \right) \qquad \text{Equation 14}$$

An example of a Polar-GCC is described below as a concatenation of Polar codes with RS codes.

Figure 4:
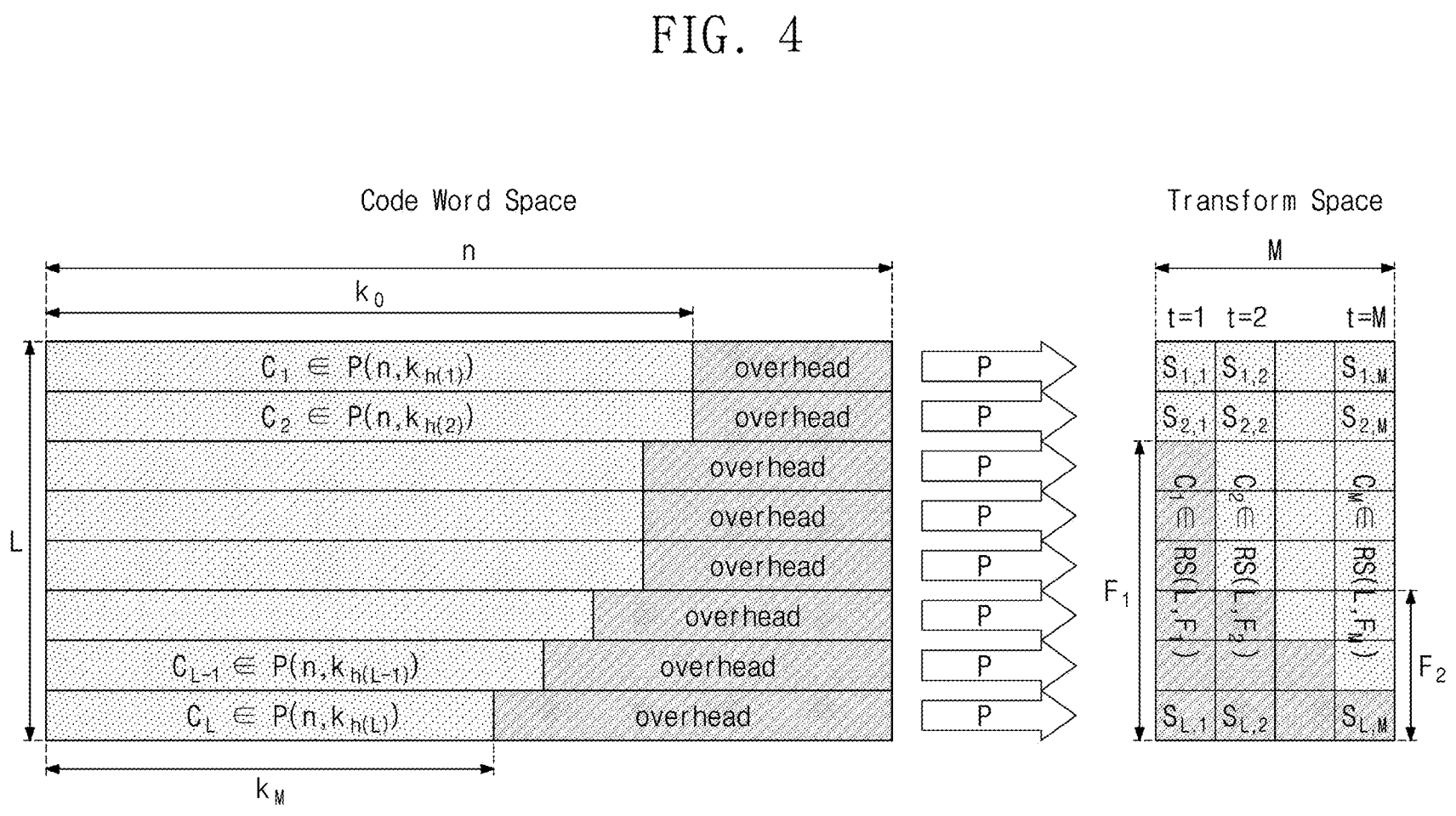

An example of a structure of a Polar-GCC is shown in FIG. 4.

Assume that we have a set of nested polar codes, as defined in Equation 1, with the corresponding disjoint sets of frozen bits locations $\phi_t \subset [n]$, $t \in [M]$, and $\phi_{t_1} \cap \phi_{t_2} = \varnothing \forall_{t_1} \neq t_2$ and the frozen set $$\phi_0^j \triangleq U_{t=0}^j \phi_t.$$

A constraint that that $$|\phi_{i-1}^i| = m \; \forall \; i \in [M]$$

and $|\phi_0|=n-k_0$ can then be added, and as a result $$|\phi_1^M| = M \cdot m.$$

L polar code words, each belonging to one of the nested codes, can then be defined where $$c_i \in P\left(n, k_{h(i)}, \phi_0^{h(i)}\right), i \in [L],$$

of length n and dimension $k_{h(i)}$, where $k_{h(1)} \geq \dots \geq k_{h(L)}$. The function h(i) maps the code word i to the corresponding polar nested code and h(1)=0 and h(L)=M. $L \geq M$, as there may be several polar code words belonging to the same polar code.

The set of static bits $\phi_0 \subset [n]$ can be defined by $u_{\phi_0}=0$. Therefore the [m·M]x[n] transform matrix P can be defined by Equation 15.

$$P \triangleq U_{\phi_1^M} \cdot G^{-1} = \begin{bmatrix} U_{\phi_0^1} \\ U_{\phi_1^2} \\ \dots \\ U_{\phi_{M-1}^M} \end{bmatrix} \cdot G^{-1} \triangleq \begin{bmatrix} P_1 \\ P_2 \\ \dots \\ P_M \end{bmatrix} \qquad \text{Equation 15}$$

The corresponding transform space symbols are defined as $s_{i,t}=P_t \cdot c_i$ for $\forall t \in [M]$ and $\forall i \in [L]$.

Next, for all $t \in [M]$, the vector of symbols $[s_{i=1,t}, s_{i=2,t}, \dots s_{i=L,t}]^T$ are defined, as a RS code word $C_t \in RS(L, F_t)$ of length L and dimension $K_t$, where $K_1 \leq K_2 \dots \leq K_M$, or equivalently with $F_1 \geq F_2 \dots \geq F_M$, where $0 \leq F_t \leq L$.

The resulting structure of the Polar-GCC is shown in FIG. 4.

Referring to FIG. 4, there is a direct relation between $$\{k_{f(i)}\}_{i=1}^L \text{ and } \{F_t\}_{t=1}^M,$$

where $F_t$ is equal to the number of rows with dimension smaller then $k_0 - t \cdot m$, as described in Equation 16

$$F_t = |\{i | k_{h(i)} < k_0 - t \cdot m\}| \qquad \text{Equation 16}$$

The Polar-GCC code is defined according to Equation 17.

$$GCC \left( L, M, n, k_0, \{F_t\}_{t=1}^M, P(n, k_{0 \to M}, \phi_0^{0 \to M}) \right) \qquad \text{Equation 17}$$

A GCC systematic encoder algorithm may be applied for any GCC code parameters. An example of a GCC encoder algorithm is discussed below. For simplicity, the GCC encoder algorithm is presented for a GCC codeword w (using polar code as constituent code). For example, $$w \in GCC \left( L, M, n, k_0, \{F_t\}_{t=1}^M, P(n, k_{0 \to M}, \phi_0^{0 \to M}) \right).$$

The coset polar encoder $c=ENC_{Polar}(i, u_\phi)$ receives information bits i and frozen values $u_\phi$ at locations $\phi$ and returns the systematic encoded word c, where $|u_\phi|=|\phi|$ and $|i|=n-|\phi|$. The information bits location is in the first bits $[n-|\phi|]$.

The RS systematic encoder $v=ENC_{RS}(u, F)$ receives information symbols u and returns the RS code word symbols v to generate a RS code word with $d_{min}=F+1$, where $|u|=L-F$ and $|v|=L$.

FIG. 5A is an example of a GCC encoder algorithm.

Figure 5B:
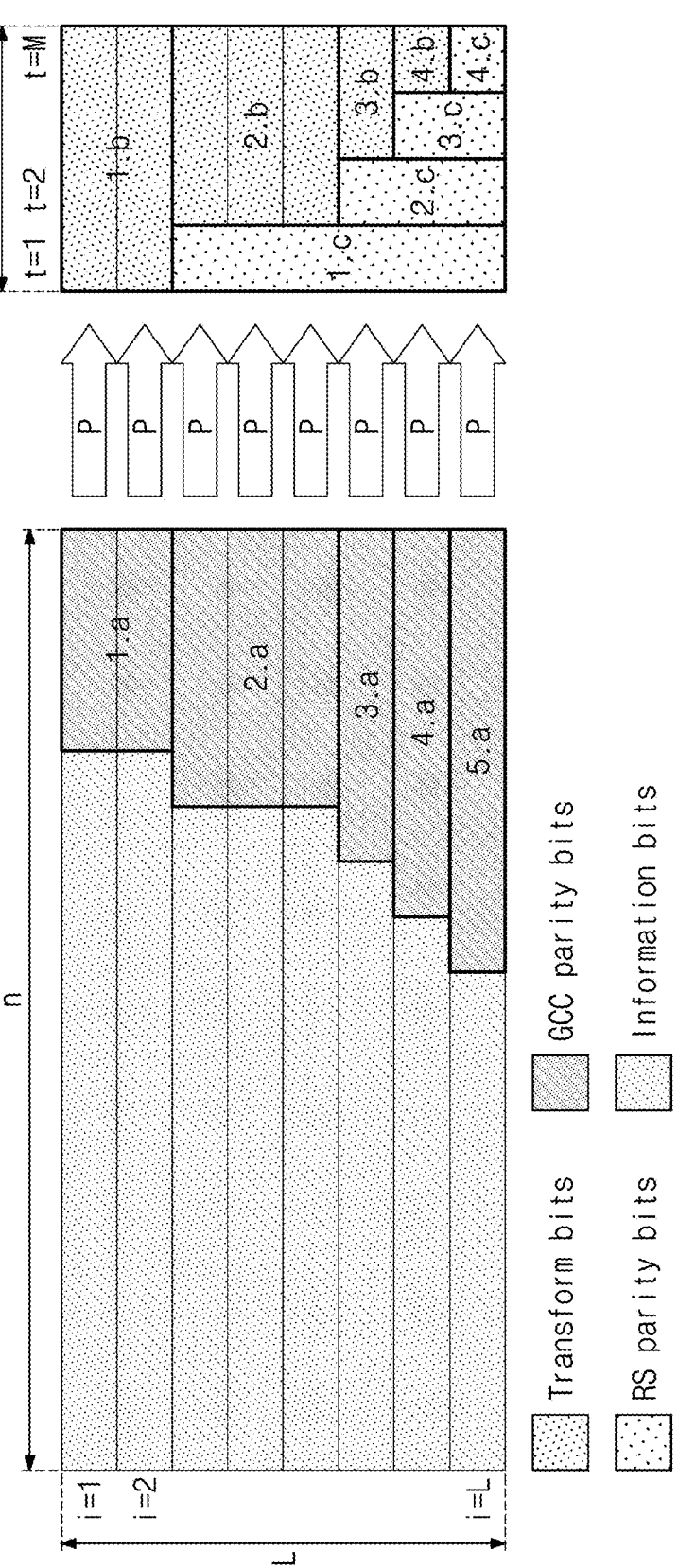
FIG. 5B is an example of an encoding order of the GCC encoder algorithm shown in FIG. 5A.

FIG. 5B is an example of an encoding order of the GCC encoder algorithm shown in FIG. 5A.

Referring to FIG. 5B, the code number of information bits is $$\sum_{i=1}^{L} k_{h(i)}$$

and the code number of overhead bits is $$L \cdot n - \sum_{i=1}^{L} k_{h(i)}.$$

The information bits locations are defined by Equation 18.

$$\gamma = \bigcup_{i=1}^{L} [(i-1) \cdot n + 1, (i-1) \cdot n + k_{h(i)}] \qquad \text{Equation 18}$$

The GCC structure allows decoding by using a sequential decoder which includes sequential activations of coset row (polar, BCH, polar-BCH sub-code) decoders, followed by activation of an RS decoder, until the entire GCC code word is decoded.

The GCC decoder algorithm includes a coset row decoder $[u, c] = \mathrm{Dec}_{row}(x, s, k_0)$ where:

$$x = \{x_l\}_{l=1}^{n}$$

a vector of measurements, where $x_l \in \{0,1\}$ (binary), $x_l \in \mathcal{R}$ or others;

$$s = \{s_q\}_{q=1}^{j}$$

cosets of size J; $k_0$ is a decoder basic correction; u—indicates the decoder success status (e.g., success or fail); and c is the decoded code word.

The GCC decoder algorithm also includes a RS decoder $[v, s, u] = \mathrm{Dec}_{RS}(s, u)$ where:

$$s = \{s_i\}_{i=1}^{L}$$

are input symbols; $s_i \in GF(2^m)$ or $s_i = E$ are erased symbols;

$$u = \{u_i\}_{i=1}^{L}$$

indicates the symbol status (e.g., erased or corrected); v indicates the decoder success status (e.g., success or fail);

$$s = \{s_i\}_{i=1}^{L}$$

indicates the corrected symbols, $s_i \in GF(2^m)$; and $$u = \{u_i\}_{i=1}^{L}$$

indicates the updated symbol status (e.g., if a symbol status was correct, but the RS decoder found an error, the symbol status becomes failure). If the RS decoder detects a symbol error at symbol i, it updates the symbol status as $u_i$=False.

The GCC decoder algorithm for a general GCC code may be represented as $$w \in GCC\left(L, M, n, k_0, \{F_j\}_{j=1}^{M}, P\left(n, k_{0 \to M'}, \phi_0^{0 \to M}\right)\right)$$

where P is the corresponding transform of the row constituent code family. For simplicity of notations, the polar code family is used as row constituent code.

FIG. 6A is an example of a GCC decoder algorithm.

Figure 6B:
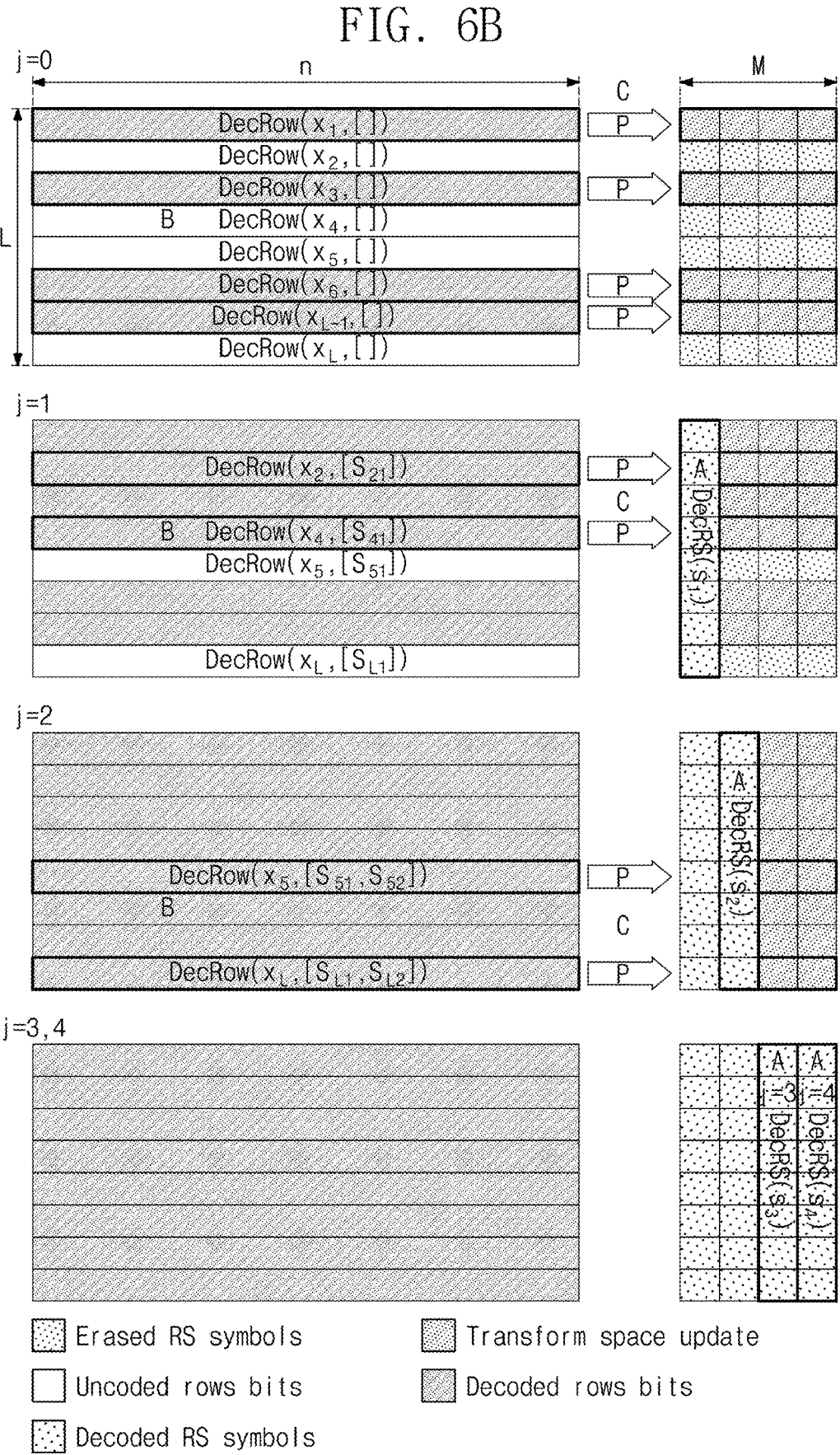
FIG. 6B is an example of an operation of the GCC decoder algorithm shown in FIG. 6A.

FIG. 6B is an example of an operation of the GCC decoder algorithm shown in FIG. 6A.

Figure 6C:
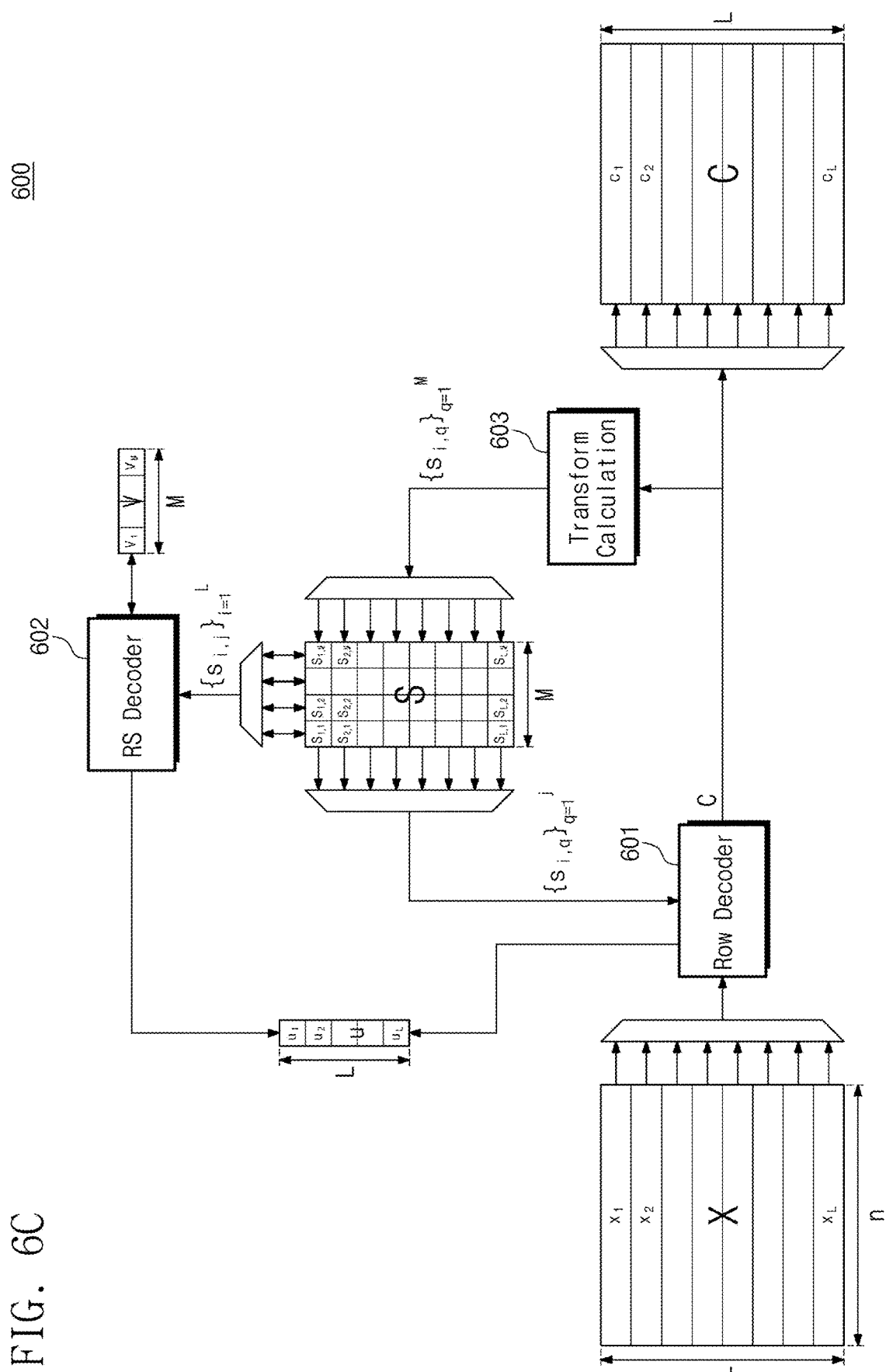
FIG. 6C is a block diagram of a GCC decoder according to example embodiments.

FIG. 6C is a block diagram of a GCC decoder according to example embodiments.

Referring to FIG. 6C, a GCC decoder 600 according to example embodiments includes a row decoder 601, a RS decoder 602, and/or a transform 603.

Referring to FIGS. 6B and 6C, for j=0 (e.g., cosets of size 0) the RS decoder 602 is not applied. The row decoder 601 is applied without coset values. In the example shown in FIG. 6B, 4 rows are decoded successfully (step B) and the corresponding transform space is updated (step C) via transform 603. However, it is understood that this is merely an example operation and more or fewer than 4 rows may be decoded successfully.

For j=1 (e.g., cosets of size 1), the RS decoder 602 corrects the missing symbols (step A). The row decoder 601 is applied on the 4 remaining rows with one coset symbol (step B). In the example shown in FIG. 6B, 2 rows are decoded successfully and the corresponding transform space is updated (step C) via transform 603. However, it is understood that this is merely an example operation and more or fewer than 2 rows may be decoded successfully.

For j=2, the RS decoder 602 corrects the missing symbols (step A). The row decoder 601 is applied on the 2 remaining rows with 2 coset symbols (step B) and the rows are decoded successfully. The corresponding transform space is updated (step C) via transform 603.

For j=3 and j=4, the RS decoder 602 corrects the missing symbols. In the example shown in FIG. 6B, as there are no erased symbols to be corrected for j=3 or j=4, the RS decoder 602 validates that the symbols are valid. In this case, there is no need to apply steps B or C.

With the above understanding of Polar-GCC and BCH-GCC, Polar sub-codes, and BCH sub-codes, a Polar BCH sub-code GCC (PBSC-GCC) construction according to example embodiments is described below.

PBSC-GCC uses the definition of a nested code family of Polar-BCH sub-codes $$Ps\left(, k_{0 \to M}, \alpha_0^{0 \to M}\right)$$

and a corresponding transform s=Z·c. Each symbol of the transform Z is generated using a transform defined by a combination of the dynamic and static frozen bits included in each of the frozen bits sets $\alpha_j$ as follow $Z^j \cdot c \triangleq D_{\alpha_j} \cdot G^{-1} \cdot c$.

PBSC-GCC, according to example embodiments, is a sub code of a BCH-GCC. The BCH-GCC will have the same number of frames, L, the same frame length n, but the nested code will be BCH(n, $\tilde{k}_{0 \to P}$, $t_{0 \to P}$) with different effective dimensions $\tilde{k}_{0 \to P}$ and the number of RS columns is $\tilde{M}$. This property of the PBSC-GCC according to example embodiments allows to decode a PBSC-GCC encoded codeword using a BCH-GCC decoder. Additionally, a codeword encoded using the PBSC-GCC encoder may be decoded in the same way as a Polar-GCC code, where the dynamic frozen bits, $\delta^{t_P}$, may be used during the polar decoder process.

As a first step in describing the PBSC-GCC construction, a nested Polar-BCH sub-code (PBSC) family is defined.

A set of nested BCH codes is denoted, as defined in Equation 4. Specifically, $$BCH\left(n, k_P^{BCH}, t_P\right) \subset BCH\left(n, k_{P-1}^{BCH}, t_{P-1}\right) \subset \cdots \subset BCH\left(n, k_0^{BCH}, t_0\right).$$

The sets of dynamic frozen bits are defined as $\delta^t$, as described above with reference to Polar sub-codes, for $t = t_0$, $t_1 \ldots t_P$. It may be observed that $\delta^{t_0} \subset \delta^{t_1} \ldots \subset \delta^{t_P}$.

A set of nested Polar codes is denoted, as defined in Equation 1. Specifically, $$P\left(n, k_M, \phi_0^M\right) \subset P\left(n, k_{M-1}, \phi_0^{M-1}\right) \subset \cdots \subset P\left(n, k_1, \phi_0^1\right) \subset P\left(n, k_0, \phi_0^0\right).$$

From the set of nested BCH codes and the set of nested Polar codes, a new set of nested polar sub-codes may be defined according to Equation 19.

Equation 19

$$Ps\left(n, k_M, \alpha_0^M\right) \subset Ps\left(n, k_{M-1}, \alpha_0^{M-1}\right) \subset \cdots \subset Ps\left(n, k_1, \alpha_0^1\right) \subset Ps\left(n, k_0, \alpha_0^0\right)$$

The sets of static and dynamic frozen bits are defined as $$\alpha_0^j = \phi_0^{w(j)} \cup \{\delta^{t_P}\}_{i=1}^{p(j)},$$

where $p(j) \subseteq [m \cdot t_P]^*$ define a mapping between the nested polar sub-codes codes and the nested BCH codes. The indices $\delta^{t_P}$ are ordered such as the first m indices correspond to $\delta^{t_0}$, the first 2m indices correspond $\delta^{t_1}$ and so on. For example, $$Ps\left(n, k_j, \alpha_0^j\right)$$

will be a sub-code of $$BCH\left(n, k_{\left\lfloor \frac{p(j)}{m} \right\rfloor - 1}^{BCH}, t_{\left\lfloor \frac{p(j)}{m} \right\rfloor - 1}\right).$$

A mapping between the nested Polar sub-codes and the polar nested codes may be defined by $w(j) \subseteq [M]^*$.

It is noted that, if an index $$i \in \phi_0^M.$$

and also $i \in \delta^{t_P}$, then $$i \in \alpha_0^j$$

is defined using the definition from $i \in \delta^{t_P}$ and the corresponding matrix $$D_i^{t_P}$$

meaning it is a dynamic frozen bit. Therefore, the construction of the dynamic bits constraints must be updated nested code for the nested code, as described below.

For the nested code, the dynamic frozen equation may be Equation 11. Specifically, $$\sum_{j \in J_{\delta_i^t}} D_{\delta_i^t, j}^t \cdot u_j + u_{\delta_i} = f_{\delta_i^t}.$$

Thus, for 2 nested BCH codes with $t_1$ and $t_2$ such that $t_0 \leq t_1 < t_2 \leq t_P$, with corresponding dynamic frozen bits sets $\delta_{t_1}$, $\delta_{t_2}$ and corresponding matrices $D^{t_1}$ and $D^{t_2}$, in order to maintain the nested code structure, $D^{t_1}$ cannot depend on the knowledge of dynamic frozen bits in $\delta_{t_2} \setminus \delta_{t_1}$ or the equivalent coset values, a relation between $D^{t_1}$ and $D^{t_2}$ must be defined.

To maintain the nested code structure as described above, according to example embodiments, dynamic frozen equations may be generated.

FIG. 7 is an example algorithm for generating dynamic frozen equations according to example embodiments.

The construction as shown in FIG. 7 generates the dynamic frozen equations corresponding to the coset bit $$f_{\Delta \delta_i^q}^q$$

according to Equation 20.

$$\sum_{j < \Delta \delta_i^q} \Delta_{i,j}^q \cdot u_j + u_{\Delta \delta_i^q} = f_{\Delta \delta_i^q}^q, \quad i \in [m \cdot (t_q - t_{q-1})], q \in [P]^* \quad \text{Equation 20}$$

Thus a matrix $$D_{\delta^t}^{t_P}$$

is defined as $$D_{\delta^t}^{t_P} \triangleq \begin{bmatrix} \Delta^0 \\ \Delta^1 \\ \cdots \\ \Delta^t \end{bmatrix}$$

FIG. 8 is an example of matrix $$D_{\delta^t}^{t_P}$$

according to example embodiments.

Referring to FIG. 8, an example of matrix $$D_{\delta^t}^{tP}$$

for an Extended BCH code of length 512 (and m=9) and t=[1,2,3,4,5] is shown. The matrices $$D_{\delta^{t+1}\setminus\delta^t}^{tP}$$

have different shades for different t (darkest gray for t=1, dark gray for t=2 . . . ), and the frozen bit leading one are marked in black (corresponding to locations $$\Delta\delta_i^q),$$

while the other ones (corresponding to $$J_{\Delta\delta_i^q})$$

are in white. As shown in FIG. 8, the matrix $$D_{\delta^0}^{tP}$$

corresponding to $t_0=1$, includes only static bits.

Denote the codeword c, c=G·u and the BCH syndrome q as $H_{t_{q-1}\to t_q}\cdot c=s^q$, and using the construction in FIG. 8, we get the following relation:

$$\left[f_{\Delta\delta^q}^q = \Delta^q\cdot u = Q^q\cdot B^q\cdot u = Q^q\cdot\left(A^q + \sum_{i=0}^{q-1}Q^{qi}\cdot\Delta^i\right)\cdot u\right] = \left[Q^q\cdot\right.$$

$$\left.\left(H_{t_{q-q}\to t_q}\cdot G\cdot u + \sum_{i=0}^{q-1}Q^{qi}\cdot\Delta^i\cdot u\right) = Q^q\cdot\left(s^q + \sum_{i=0}^{q-1}Q^{qi}\cdot f_{\Delta\delta^i}^i\right)\right]$$

summarized in Equation 21.

$$f_{\Delta\delta^q}^q = Q^q\cdot\left(s^q + \sum_{i=0}^{q-1}Q^{qi}\cdot f_{\Delta\delta^i}^i\right)$$ 
Equation 21

Equivalently to Equation 21, the relation between the coset values belonging to the dynamic frozen $\delta_{t_q}$ and the BCH syndrome coset can be expressed according to Equation 22.

$$s^q = (Q^q)^{-1}\cdot f_{\Delta\delta^q}^q + \sum_{i=0}^{q-1}Q^{qi}\cdot f_{\Delta\delta^i}^i$$ 
Equation 22

With the PBSC-GCC nested codes defined, a transform for the PBSC-GCC may be defined as discussed below.

For the nested polar-BCH sub code defined according to Equation 19, constraints that $$|\alpha_j^j| = m\ \forall\ j\in[M]\text{ and }|\alpha_0^0| = n - k_0$$

may be added. As a result $$|\alpha_1^M| = M.$$
$$m.$$

It is noted that that $$\alpha_i^j\subseteq\delta^{tP}\text{ and }a_i^j\subseteq\phi_0^M.$$

Thus, indices that appear both in $$\phi_0^M$$

and $\delta^{tp}$ are counted only once, as dynamic frozen bits.

For each $\upsilon\in\alpha$, the rows of matrix $D^{tp}$ have the property that $$D_{\upsilon}^{tP}\cdot u = f_{\upsilon},$$

where $\upsilon$ may be static frozen and defined as $D_\upsilon=\hat{e}_\upsilon$ (unity vector) or it can be dynamic frozen, and defined according to Equation 20, where $$D_\upsilon = D_\upsilon^{tP}.$$

The frozen bits are then replaced with the code word $u=G^{-1}\cdot c$ and the transform $Z^j$ is defined, corresponding to the index set $$\alpha_j = \alpha_j^j\text{ as, }Z^j\cdot c \triangleq D_{\alpha_j}\cdot G^{-1}\cdot c =$$
$$f_{\alpha_j^j} \triangleq f^j,\text{ and }Z^j\cdot c \triangleq D_{\alpha_j}\cdot G^{-1}\cdot c = f_{\alpha_j^j} \triangleq f^j.$$

The transform space symbols of code word c may therefore be given by Equation 23.

$$f \triangleq \begin{bmatrix} Z^1 \\ Z^2 \\ \dots \\ Z^M \end{bmatrix}\cdot c \triangleq Z\cdot c$$ 
Equation 23

Finally, the PBSC is concatenated with RS codes to define the PBSC-GCC. A description for concatenating the PBSC with RS codes according to example embodiments is provided below.

FIG. 9 is an example of the PBSC-GCC code structure according to example embodiments.

The set of nested PBSC codes may be defined using Equation 19, as discussed above. Specifically, the set of nested PBSC codes may be defined as $$Ps\left(n, k_M, \alpha_0^M\right) \subset$$
$$Ps\left(n, k_{M-1}, \alpha_0^{M-1}\right) \subset \ \ldots \ \subset Ps\left(n, k_1, \alpha_0^1\right) \subset Ps\left(n, k_0, \alpha_0^0\right).$$

From the set of nested PBSC codes, L PBSC code words may be defined, each code word of the L code words belonging to one of the nested codes, where $$c_i \in$$
$$Ps\left(n, k_{h(i)}, \alpha_0^{h(i)}\right), i \in [L],$$

of length n and dimension $k_{h(i)}$, where $k_{h(1)} \geq \ldots \geq k_{h(L)}$. The function h(i) maps the code word i to the corresponding polar nested code and h(1)=0 and h(L)=M. L≥M, as there may be several polar code words belonging to the same polar code.

$Z^0 \cdot c = 0$ can then be defined for all code words $c_i$ i∈[L], defined by the set $$\alpha_0^0.$$

Equation 25 can inen be used to define the [m·M]x[n] transform matrix Z. The corresponding transform space symbols may then be defined as $f_{i,t} = Z^t \cdot c_i$ for ∀t∈[M] and ∀i∈[L].

Next, for all t∈[M], the vector symbols $[f_{i=1,t}, f_{i=2,t}, \ldots f_{i=L,t}]^T$ are defined, as a RS code word $C_t \in RS(L, F_t)$ of length L and dimension $K_t$, where $K_1 \leq K_2 \ldots \leq K_M$, or equivalently with $F_1 \geq F_2 \ldots \geq F_M$, where $0 \leq F_t \leq L$.

Referring to FIG. 9, there is a direct relation between $$\{k_{h(i)}\}_{i=1}^L \ \text{and} \ \{F_t\}_{t=1}^M,$$

where $F_t$ is equal to the number of rows with dimension smaller then $k_0 - t \cdot m$, as described by Equation 24.

$$F_t = |\{i | k_{h(i)} < k_0 - t \cdot m\}| \qquad \text{Equation 24}$$

The PBSC-GCC code according to example embodiments may be defined according to Equation 25.

$$GCC\left(L, M, n, k_0, \{F_t\}_{t=1}^M, Ps\left(n, k_{0 \to M}, \alpha_0^{0 \to M}\right)\right) \qquad \text{Equation 25}$$

A code word encoded using the PBSC-GCC may also be viewed and decoded as a BCH-GCC code. In order for a BCH-GCC decoder to decode the code word encoded using the PBSC-GCC, the transform space M may be further transformed to a transform space of the syndrome coset for BCH-GCC codes.

As described above, the PBSC-GCC is defined with $$\alpha_0^M = [\alpha_0, \alpha_1, \alpha_2, \ldots \alpha_M]$$

and for each set $\alpha_j$ there is a corresponding transform $Z^j$, such that $Z^j \cdot c_i = f_{i,j}$. Equation 22 may be applied to the transform $Z^j$ to generate the BCH coset syndrome $s^q$.

In order to generate the BCH coset syndrome $s^q$ according to Equation 22, we need to know $$f_{\Delta \delta^i}^i i = 0, \ldots q.$$

In order to know all coset syndromes $$\{s_i^0, s_i^1, \ldots s_i^t\}$$

or frame i, it is required to know all RS symbols $f_{i,j}$, where $j=1, 2, \ldots v(t)$ such that $$\delta^t \subseteq \alpha_0^{v(t)}.$$

FIG. 10 is an example mapping between $$\alpha_0^M$$

and $\delta^{tp}$ according to example embodiments.

Referring to FIG. 10, it is noted that $|\alpha_j|=m$ may be represented as a symbol in the Galois field $GF(2^m)$ for j>0. There is no limitation on the size $|\alpha_0|.|\Delta \delta^q|=m_{BCH}$ does not necessarily equal to m, and represents the BCH Galois field $GF(2^{m_{BCH}})$. The order of the indices of $\Delta \delta^q$ is not necessarily consecutive in $$\alpha_0^M.$$

Additionally, for this example, a relationship between t and v(t) is shown in Table 2. According to table 2, for example, to decode a BCH with t=4 would need $$\alpha_0^7.$$

TABLE 2

| t | v(t) |
|---|------|
| 0 | 0 |
| 1 | 2 |
| 2 | 2 |
| 3 | 4 |
| 4 | 7 |

FIG. 11 is an example of an effective BCH-GCC decoder according to example embodiments.

As described above, an effective BCH-GCC decoder according to example embodiments may use Equation 22 to generate the transform space of the syndrome coset for BCH-GCC codes from the transform space M.

The symbols $$\{f_{i,t}\}_{i=1}^{L}$$

form a RS code word, with protection $F_t$, however, the symbols $$\{s_{i,t}\}_{i=1}^{L}$$

do not form RS code words directly, but have similar behavior. For the BCH nested code, in order to decode the BCH code word with t errors, it is required to collect $f_{i,j}$, where j=1, 2, . . . v(t) such that $$\delta^t \subseteq \alpha_0^{v(t)}$$

in order to generate syndromes $s_0 \ldots s_t$.

A code word encoded using the PBSC-GCC may also be viewed and decoded as a Polar-GCC code. Using the transform space M generated by the transform matrix Z. As described above, the PBSC nested codes include the sets $$\alpha_0^j = \phi_0^{w(j)} \cup \{\delta^{tp}\}_{i=1}^{P(j)},$$

a combination of polar static frozen bits and BCH dynamic frozen bits. A Polar code decoder may be based on Successive-Cancelation List (SC-L) decoder, where the bits are decoded sequentially, given previous decisions.

For static frozen bits, the bit value is taken as is. In case a static frozen bit is replaced by a dynamic frozen bit the behavior in the decoder is the same, as the dynamic frozen bit value is calculated according to Equation 20. Therefore, in term of the decoder, the replacement of a static frozen bit to a dynamic frozen bit is equivalent.

Finally, the SC-L decoder may use a CRC to select the correct solution from the list result of the SC-L decoder. Instead of using a CRC, some of the dynamic frozen bits can be used for the same purpose using Equation 20.

Therefore, according to example embodiments, the decoder may apply a relatively fast and relatively low complexity decoder of BCH-GCC codes that have good performance for HD channels.

A code word encoded using the PBSC-GCC may also be viewed and decoded as a Polar-GCC code. Therefore, according to example embodiments, the decoder may apply Polar-GCC codes, that have good performance for SD channels, but might have higher complexity and latency.

FIG. 12 is an example method for performing a write operation according to example embodiments.

Referring to FIGS. 2B and 12, at S1200 the memory controller 210 receives a write request from the host 100. For example, the host 100 may transmit a logical address (LBA—Logic Block Address) and data to the memory controller 210. The FTL 214 of the memory controller 210 breaks the data to ECC data words and sets corresponding physical addresses for the NVM 220.

At S1205, the memory controller 210 generates a codeword from the ECC data. For example, the encoder 217a generates the codeword by adding redundancy bits to the ECC data. According to example embodiments, the encoder 217a may be a PBSC-GCC encoder. For example, the encoder 217a may generate the redundancy bits to the ECC data by applying the GCC encoder algorithm, as appear in FIG. 5A for GCC of type PBSC-GCC, by replacing the polar coset systematic encoder in step a with a polar sub-code coset systematic encoder. For example, a systematic encoder 217a may use Polar-BCH sub-codes, as discussed above.

At S1210, the memory controller 210 programs the codeword to the NVM 220. For example, the memory controller 210 may merge a plurality of codewords together using known modulations, and program the merged codewords to the NVM 220.

FIG. 13 is an example method for performing a read operation according to example embodiments.

Referring to FIGS. 2B and 13, at S1300 the memory controller 210 receives a read request from the host 100. For example, the host 100 may transmit a read request along with a LBA to the memory controller 210.

The memory controller 210 translates the request, by the FTL 214, to physical addresses. The NVM 220 transfers the corresponding read data which is demodulated and processed to generate ECC noisy codewords. For example, the memory controller 210 may perform a fast read operation to receive the ECC noisy codewords. For example, the memory controller 210 may receive the ECC noisy codewords in a HD channel. Here, the ECC noisy codewords may refer to the ECC code word, read via the fast read from the NVM 220, with some possible errors.

At S1305, the memory controller 210 determines a mode for decoding the ECC noisy codewords. For example, the memory controller 210 may determine to decode the ECC noisy codeword via a low complexity path or a high complexity path of the decoder 217b. For example, the memory controller 210 may initially attempt to decode the ECC noisy codeword via the low complexity path at high throughput. If the decoder 217b is unable to decode the ECC noisy codeword via the low complexity path (e.g., several failed attempts) then the memory controller 210 may attempt to decode the ECC noisy codeword via the high complexity path.

FIG. 14 is a block diagram of an example of an ECC decoder according to example embodiments.

Referring to FIG. 14, ECC decoder 217b includes a BCH-GCC decoder 217b1 and a Polar-GCC decoder 217b2. The BCH-GCC decoder 217b1 and the Polar-GCC decoder 217b2 apply the GCC-Decoder algorithm as described in FIG. 6A. For step B, the row decoder 601 in FIG. 6C is a BCH decoder/Polar decoder respectively, and for step C, the transform 603 is Z/Z+Equation 22 respectively.

Returning to FIG. 13, if the memory controller 210 determines to decode the ECC noisy codeword via the low complexity (LOW at S1305), the method proceeds to S1310.

At S1310, the memory device 217 decodes the ECC noisy codeword using a low complexity decoder. For example, the memory device 217 may decode at least a portion of the ECC noisy codeword using the BCH-GCC decoder 217b1.

For example, the BCH-GCC decoder 217b1 may apply the transform Z and the transform according to Equation 22, as discussed above, to the ECC noisy codeword to generate a transform space p (as shown in FIG. 11).

The BCH-GCC decoder 217*b*1 may decode at least a portion of the codeword based on the generated transform space p. For example, as discussed further below in the example operation, the BCH-GCC decoder may successfully decode some cosets, but not other cosets. For example, the BCH-GCC decoder 217*b*1 may successfully decode the first BCH-GCC cosets up to $$q = t\left(\{s_q\}_{q=1}^t\right),$$

but may fail to decode higher cosets above t (q=t+1, ..., P).

At S1315, the memory controller 210 determines whether the BCH-GCC decoder 217*b*1 successfully decoded the ECC noisy codeword. If the BCH-GCC decoder 217*b*1 successfully decoded the ECC noisy codeword (Y at S1315), then the method proceeds to S1325 and continues as discussed below. If the BCH-GCC decoder 217*b*1 did not successfully decode the ECC noisy codeword, then the method proceeds to S1320 and continues as discussed below.

Returning to S1305, if the memory controller 210 determines to decode the ECC noisy codeword via the high complexity path of the decoder (HIGH at S1305), the method proceeds to S1320.

At S1320, the memory device 217 decodes at least a portion of the ECC noisy codeword using a high complexity decoder. For example, the memory device 217 may decode the ECC noisy codeword using the Polar-GCC decoder 217*b*2. For example, as noted above and discussed in more detail below with regard to the example operation, in a case that the BCH-GCC decoder 2171*b*1 successfully decodes the first BCH-GCC cosets up to $$q = t\left(\{s_q\}_{q=1}^t\right),$$

and as a result the first m Polar-GCC cosets $$\{f_q\}_{q=1}^m,$$

the Polar-GCC decoder 2172*b*2 may decode additional Polar-GCC cosets, up to $$M\,\{f_q\}_{q=m+1}^m.$$

For example, the Polar-GCC decoder 217*b*2 may apply a transform according to the transform matrix Z to generate a transform space M (as shown in FIG. 9).

The Polar-GCC decoder 217*b*2 may decode the codeword based on the generated transform space M.

At S1325, the memory device 217 may transmit the decoded noisy ECC codeword to the host as the requested data.

Therefore, according to example embodiments, a codeword encoded by the PBSC-GCC encoder may be decoded by a BCH-GCC decoder or a Polar-GCC decoder. The codeword may therefore be passed from the BCH-GCC decoder to the Polar-GCC decoder in case the BCH-GCC decoder is unable to decode the codeword. Accordingly, the memory device 217 may be able to successfully decode an ECC noisy codeword without having to perform a successive read operation on the NVM device in case of a failure to decode the ECC noisy codeword by the lower complexity (BCH-GCC) decoder. Accordingly, an efficiency of the memory device may be increased. The BCH-GCC decoder and Polar-GCC decoder may share information and work sequentially or iteratively to improve the overall correction capability.

FIG. 19 is a block diagram of an example of an ECC decoder according to example embodiments.

Referring to FIG. 19, the BCH-GCC decoder 217*b*1 includes a BCH decoder 601*a*, the Z transform, the RS decoder 602, and Equation 22 and the Polar-GCC decoder 217*b*2 includes a polar decoder 601*b*, the Z transform, the RS decoder 602, and Equation 22.

The BCH decoder 601*a* is applied on the noisy PBSC words $$\{x_i\}_{i=1}^L.$$

If decoding is successful, the BCH decoder 601*a* generates the decoded code word $$\{c_i\}_{i=1}^L.$$

The BCH decoder 601*a* uses the available BCH coset syndromes $$\{s_{i,q}\}_{q=1}^j$$

for decoding.

The BCH decoder 601*a* generates a corresponding row in the transform space M by applying the matrix Z on the code word and generating the frozen bits $$\{f_{i,j}\}_{j=1}^M$$

according to Equation 23. Then the BCH decoder 601*a* calculates the syndrome cosets $$\{s_{i,q}\}_{q=1}^P$$

using equation (22) and updates the corresponding row in the BCH-GCC transform space P.

Once the BCH-GCC decoder 217*b*1 cannot correct any more rows, the RS decoder 602 is applied on the transform space M columns $$\{f_{i,j}\}_{i=1}^L,$$

and using equation (22), the corresponding BCH coset syndromes $$\{s_{i,q}\}_{i=1}^L$$

are calculated. The RS decoder 602 updates the decoded columns in $$\{v_j\}_{j=1}^{M}.$$

The updated BCH coset syndromes are then used by the BCH decoder 601$a$ for the next stage. The BCH decoder 601$a$ updates the decoded rows in $$\{u_j\}_{i=1}^{L}.$$

Once the BCH-GCC decoder 217$b$1 cannot advance any more, the Polar-GCC decoder 217$b$2 may be applied on the remaining rows, using the current status of $$\{u_j\}_{i=1}^{L}, \{v_j\}_{j=1}^{M}$$

the decoded word so far $$\{c_i\}_{i=1}^{L}$$

and the transform space $$M \ \{f_{i,j}\}_{i=1,j=1}^{i=L,j=M}.$$

The Polar decoder 601$b$ attempts to decode the remining noisy PBSC words $$\{x_i\}_{i=1}^{L}$$

and if decoding is successful, updates the decoded code word $$\{c_i\}_{i=1}^{L}.$$

The Polar decoder 601$b$ uses the available frozen bits $$\{f_{i,j}\}_{i=1}^{L}$$

for decoding.

The Polar decoder 601$b$ generates the corresponding row in the transform space M by applying the matrix Z on the code word and generating the frozen bits $$\{f_{i,j}\}_{j=1}^{j=M}$$

according to Equation 23. However, the Polar decoder 601$b$ may not update the syndrome cosets $$\{s_{i,q}\}_{q=1}^{q=P}$$

at this stage.

Once the Polar decoder 601$b$ cannot correct any more rows, the RS decoder 602 is applied on the transform space M columns $$\{f_{i,j}\}_{i=1}^{i=L},$$

and using equation (22), and the RS decoder 602 updates the decoded columns in $$\{v_j\}_{j=1}^{M}.$$

The updated frozen bits are then used by the Polar Decoder 601$b$ for the next stage.

According to some example embodiments, a noisy code word may be decoded using only the BCH-GCC decoder 217$b$1, only the Polar-GCC decoder 217$b$2, or a combination of the BCH-GCC decoder 217$b$1 and the Polar-GCC decoder 217$b$2. For example, according to some example embodiments, a noisy code word may be decoded by applying iterations between the BCH-GCC decoder 217$b$1 and the Polar-GCC decoder 217$b$2. For example, the BCH-GCC decoder 217$b$1 may be applied to the noisy code word to decode a portion of the noisy code word, followed by applying the Polar-GCC decoder 217$b$2 to the noisy code word to decode a portion of the noisy code word, followed by applying the BCH-GCC decoder 217$b$1 to the noisy code word to decode a portion of the noisy code word, etc.

An example operation of the ECC decoder 217$b$ is described below.

FIG. 15 is a schematic representation of the PBSC-GCC code, according to example embodiments, with example parameter definitions.

Referring to FIG. 15, for purposes of the example operation, PBSC-GCC code parameters are defined as L=6, M=3, n=512, $k_0$=492, and $$\{F_t\}_{t=1}^{3} = [4 \ 2 \ 1],$$

and n=512. However, it is understood that the example embodiments are not limited to the above parameter definitions. The parameters may be predefined (or alternately given). For example, the parameter definitions may be hard coded in the ECC decoder 217$b$.

For purposes of the example operation, a primitive polynomial of the BCH-GCC decoder is defined as $x^9+x^4+1$ and $m_{BCH}$=9. $T_0$=1 dynamic frozen (alternatively, static frozen) bit, including a parity bit is expressed as $\delta^{r_0}$=$u_0$, $u_1$, $u_2$, $u_4$, $u_8$, $u_{16}$, $u_{32}$, $u_{64}$, $u_{128}$, $u_{256}$ and $t_1$=2 dynamic frozen bits is expressed as $\delta^{r_1} \backslash \delta^{r_0}$=$u_{384}$, $u_{320}$, $u_{288}$, $u_{272}$, $u_{264}$, $u_{260}$, $u_{258}$, $u_{257}$, $u_{192}$. These parameters may be predefined (or alternately given). For example, the parameter definitions may be hard coded in the ECC decoder 217$b$.

FIGS. 16A and 16B are examples of an example D matrix according to example embodiments.

FIG. 16C is an example of D matrix parameters according to example embodiments.

Referring to FIGS. 16A-16C, the D matrix may be predefined (or alternately given). For example, the D matrix may be hard coded in the ECC decoder 217*b*. The D matrix described by FIGS. 16A-16C are for example purposes only.

Frozen bits and RS symbols for the decoder 217*b* may be set in advance. For example, the frozen bits and RS symbols may be hard coded in the ECC decoder 217*b*. The following example frozen bits and RS symbols are provided for example purposes only.

For j=0 and RS symbols, $\alpha_0$=[0,1,2,4,8,16,32,64,128,256, 264,260,258,257,192,3,5,6,9,10], $$\alpha_1^1 = [384, 320, 288, 272, 14, 19, 21]$$

—corresponding to $$\{f_{i,1}\}_{i=1}^6, \alpha_2^2 = \{35, 22, 25, 37, 26, 38, 67]$$

—corresponding to $$\{f_{i,2}\}_{i=1}^6, \text{ and } \alpha_3^3 = \{41, 28, 15, 69, 42, 49, 70, 44]$$

—corresponding to $$\{f_{i,3}\}_{i=1}^6.$$

Notice that, in this example, $$|\alpha_i^j| = 7 \text{ for } i > 0$$

represents the RS symbols.

The static frozen bis may be set as $\phi_0$=[3,5,6,9,10], $\phi_1$=[14,19,21], $\phi_2$=[35,22,25,37,26,38,67], and $\phi_3$=[41,28, 15,69,42,49,70,44].

FIG. 17 shows a relation between the static and dynamic frozen bits according to the example.

Referring to FIG. 17, it can be seen that w=[0 1 2 3], p=[0 1 1 1], $$\alpha_0 = \phi_0 \cup \delta^{r_0}, \alpha_1 = \phi_0^1 \cup \delta^{r_1}, \alpha_2 = \phi_0^2 \cup \delta^{r_1}, \text{ and } \alpha_3 = \phi_0^3 \cup \delta^{r_1}.$$

The example algorithm shown in FIGS. 18A-18C shows an example of the PBSC-GCC decoder set according to the example parameters as defined above.

One or more of the elements disclosed above may include or be implemented in one or more processing circuitries such as hardware including logic circuits; a hardware/software combination such as a processor executing software; or a combination thereof. For example, the processing circuitries more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

According to some example embodiments of the inventive concepts, an image signal processing device that downsizes image data for machine vision and an operation method of the image signal processing device may be provided. According to some example embodiments of the inventive concepts, when a machine vision system is implemented using the downsized image data, the computation of the machine vision system may decrease. Accordingly, a processing speed of the machine vision system may be improved, and power consumption thereof may decrease.

While the inventive concepts have been described with reference to some example embodiments thereof, it will be apparent to those of ordinary skill in the art that various changes and modifications may be made thereto without departing from the spirit and scope of the inventive concepts as set forth in the following claims.

What is claimed is:

1. A nonvolatile memory device comprising:
a memory; and
processing circuitry including a first decoder and a second decoder, wherein the processing circuitry is configured to:
receive a read request from a host,
read an ECC noisy codeword from the memory based on the read request,
determine the first decoder or the second decoder for decoding the ECC noisy codeword, and
decode the ECC noisy codeword using the determined decoder, wherein the first decoder is configured to:
generate a first transform space by applying a first transform to the ECC noisy codeword, wherein the first transform comprises a transform matrix,
generate a second transform space by applying a second transform to the first transform space, wherein the second transform comprises an equation, and
wherein the second decoder is configured to:
generate the first transform space by applying the first transform to the ECC noisy codeword.

2. The nonvolatile memory device according to claim 1, wherein the first decoder is configured to handle a first decoding complexity and the second decoder is configured to handle a second decoding complexity that is greater than the first decoding complexity.

3. The nonvolatile memory device according to claim 1, wherein the first decoder is a Bose-Chaudhuri-Hocquenghem generalized concatenated codes (BCH-GCC) and the second decoder is a Polar-GCC decoder.

4. The nonvolatile memory device according to claim 1, wherein the processing circuitry is configured to decode the ECC noisy codeword using the second decoder in response to an attempt to decode the ECC noisy codeword by the first decoder being unsuccessful.

5. The nonvolatile memory device according to claim 1, wherein the processing circuitry is configured to:
decode the ECC noisy codeword using the second decoder based on the first transform space in response to determining to decode the ECC noisy codeword using the second decoder.

6. The nonvolatile memory device according to claim 1, wherein the processing circuitry is configured to:

decode the ECC noisy codeword using the first decoder based on the second transform space in response to determining to decode the ECC noisy codeword using the first decoder.

7. The nonvolatile memory device according to claim 6, wherein the processing circuitry is configured to generate the second transform space by applying an equation $$s^q = (Q^q)^{-1} \cdot f^q_{\Delta\delta^q} + \sum_{i=0}^{q-1} Q^{qi} \cdot f^i_{\Delta\delta^i}$$

to the first transform space,
wherein $s^q$ is a BCH syndrome for a stage q,
$\Delta\delta^q$ is a dynamic frozen set for the stage q,
$\Delta\delta^i$ is a dynamic frozen set for a stage i, $$f^q_{\Delta\delta^q}$$

is a coset value corresponding to the dynamic frozen set $\Delta\delta^q$, $$f^i_{\Delta\delta^i}$$

is a coset value corresponding to the dynamic frozen set $\Delta\delta^i$
$Q^q$ is a matrix representing row operations used to generate the dynamic frozen set $\Delta\delta^q$, and
$Q^{qi}$ is a matrix representing row operations that define a relationship between the stage q and the stage i.

8. The nonvolatile memory device according to claim 1, wherein the processing circuitry is configured to encode a codeword using a polar sub-code coset systematic encoder on data transmitted from the host.

9. The nonvolatile memory device according to claim 1, wherein the processing circuitry is configured to decode a portion of the ECC noisy codeword using the second decoder in response to the first decoder failing to decode the portion of the ECC noisy codeword.

10. The nonvolatile memory device according to claim 1, wherein the processing circuitry is configured to decode the ECC noisy codeword using the first decoder and the second decoder iteratively.

11. A method for performing error correction, the method comprising:
receiving a read request from a host;
reading an ECC noisy codeword from a memory based on the read request,
determining a first decoder or a second decoder for decoding the ECC noisy codeword; and
decoding the ECC noisy codeword using the determined decoder,
wherein the decoding the ECC noisy codeword includes:
generating a first transform space by applying a first transform to the ECC noisy codeword, wherein the first transform comprises a transform matrix,
generating a second transform space by applying a second transform to the first transform space, wherein the second transform comprises an equation, decoding the ECC noisy codeword based on the first transform and the second transform in response to determining to decode the ECC noisy using the first decoder, and
decoding the ECC noisy codeword based on the first transform in response to determining to decode the ECC noisy using the second decoder.

12. The method of claim 11, wherein the first decoder is configured to handle a first decoding complexity and the second decoder is configured to handle a second decoding complexity that is greater than the first decoding complexity.

13. The method of claim 11, wherein the first decoder is a Bose-Chaudhuri-Hocquenghem generalized concatenated codes (BCH-GCC) and the second decoder is a Polar-GCC decoder.

14. The method of claim 11, wherein the decoding the ECC noisy codeword includes:
decoding the ECC noisy codeword using the second decoder in response to an attempt to decode the ECC noisy codeword by the first decoder being unsuccessful.

15. The method of claim 11, wherein the generating the second transform space includes generating the second transform space by applying an equation $$s^q = (Q^q)^{-1} \cdot f^q_{\Delta\delta^q} + \sum_{i=0}^{q-1} Q^{qi} \cdot f^i_{\Delta\delta^i}$$

to the first transform space,
wherein $s^q$ is a BCH syndrome for a stage q,
$\Delta\delta^q$ is a dynamic frozen set for the stage q,
$\Delta\delta^i$ is a dynamic frozen set for a stage i, $$f^q_{\Delta\delta^q}$$

is a coset value corresponding to the dynamic frozen set $\Delta\delta^q$, $$f^i_{\Delta\delta^i}$$

is a coset value corresponding w the dynamic frozen set $\Delta\delta^i$,
$Q^q$ is a matrix representing row operations used to generate the dynamic frozen set 484, and
$Q^{qi}$ is a matrix representing row operations that define a relationship between the stage q and the stage i.

16. The method of claim 11, further comprising encoding a codeword using a polar sub-code coset systematic encoder on data transmitted from the host.

17. The method of claim 11, wherein the decoding the ECC noisy codeword includes decoding a portion of the ECC noisy codeword using the second decoder in response to the first decoder failing to decode the portion of the ECC noisy codeword.

18. The method of claim 11, wherein the decoding the ECC noisy codeword includes decoding the noisy codeword using the first decoder and the second decoder iteratively.

\* \* \* \* \*